(12) United States Patent
Lee

(10) Patent No.: US 11,502,142 B2
(45) Date of Patent: Nov. 15, 2022

(54) DISPLAY DEVICE

(71) Applicant: Samsung Display Co., Ltd., Yongin-si (KR)

(72) Inventor: Hyeon Bum Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/321,180

(22) Filed: May 14, 2021

(65) Prior Publication Data
US 2022/0140010 A1 May 5, 2022

(30) Foreign Application Priority Data

Nov. 4, 2020 (KR) .......................... 10-2020-0146155

(51) Int. Cl.
*G09G 5/00* (2006.01)
*H01L 27/32* (2006.01)
*H01L 51/52* (2006.01)

(52) U.S. Cl.
CPC .......... *H01L 27/323* (2013.01); *H01L 27/326* (2013.01); *H01L 27/3246* (2013.01); *H01L 51/5253* (2013.01)

(58) Field of Classification Search
CPC . H01L 27/323; H01L 27/3246; H01L 27/326; H01L 51/5253
USPC ........................................................ 345/173
See application file for complete search history.

(56) References Cited

U.S. PATENT DOCUMENTS

| | | | |
|---|---|---|---|
| 10,644,083 | B2 | 5/2020 | Lee et al. |
| 2016/0320885 | A1* | 11/2016 | Kim ...................... G06F 3/0446 |
| 2019/0115404 | A1* | 4/2019 | Moon ................. H01L 51/5275 |
| 2019/0165074 | A1* | 5/2019 | Lee ........................ H01L 51/524 |
| 2019/0355935 | A1* | 11/2019 | Jung ................... H01L 51/5275 |

FOREIGN PATENT DOCUMENTS

| | | |
|---|---|---|
| KR | 10-2019-0041558 A | 4/2019 |
| KR | 10-2019-0062678 A | 6/2019 |
| KR | 10-2020-0089379 A | 7/2020 |

* cited by examiner

*Primary Examiner* — Jennifer T Nguyen
(74) *Attorney, Agent, or Firm* — Lewis Roca Rothgerber Christie LLP

(57) ABSTRACT

A display device includes a substrate; a transistor on the substrate; a first electrode electrically connected to the transistor; a pixel defining layer on the first electrode, the pixel defining layer including a pixel opening overlapping the first electrode; an emission layer and a second electrode overlapping the first electrode; a touch electrode on the second electrode; a first low refraction layer and a second low refraction layer overlapping the touch electrode; and a high refraction layer on the second low refraction layer. The first low refraction layer includes a first opening. The second low refraction layer includes a second opening. The first opening, the second opening, and the pixel opening have different widths in a first diagonal direction.

20 Claims, 21 Drawing Sheets

DISPLAY DEVICE

CROSS-REFERENCE TO RELATED APPLICATION

This application claims priority to and the benefit of Korean Patent Application No. 10-2020-0146155 filed in the Korean Intellectual Property Office (KIPO) on Nov. 4, 2020, the entire contents of which are incorporated by reference herein.

BACKGROUND

1. Field

The present disclosure relates to a display device.

2. Description of Related Art

A display device is a device for displaying images on a screen, and includes a liquid crystal display (LCD) and an organic light emitting diode (OLED) display. The display device is used for various electronic devices such as portable phones, global positioning systems (GPS), digital cameras, electronic books, portable game devices, or various terminals.

The display device may have a multilayer structure. For example, the display device may be configured with a multilayer structure in which a light-emitting device and a touch sensor are stacked on a substrate. An image may be displayed when light generated by the light-emitting device passes through layers of the display device and is discharged outside the display device. However, some of the light generated by the light-emitting device is reflected in an undesirable direction at an interlayer interface of the display device, and therefore, the reflected light may not be discharged to the outside of the display device. Accordingly, light output efficiency and display quality of the display device may be reduced.

The above information disclosed in this Background section is only for enhancement of understanding of the background of the present disclosure, and therefore it may contain information that does not constitute prior art.

SUMMARY

Aspects of one or more embodiments of the present disclosure are directed towards a display device having improved light output efficiency and display quality.

An embodiment of the present disclosure provides a display device including: a substrate; a transistor on the substrate; a first electrode electrically connected to the transistor; a pixel defining layer on the first electrode, the pixel defining layer including a pixel opening overlapping the first electrode; an emission layer and a second electrode overlapping the first electrode; a touch electrode on the second electrode; a first low refraction layer and a second low refraction layer overlapping the touch electrode; and a high refraction layer on the second low refraction layer. The first low refraction layer includes a first opening, the second low refraction layer includes a second opening. The first opening, the second opening, and the pixel opening have different widths in a first diagonal direction.

The first low refraction layer and the second low refraction layer may have different refractive indexes.

The second opening may be smaller in width in the first diagonal direction than the first opening.

The first opening, the second opening, and the pixel opening may have different widths in a second diagonal direction.

The first opening may be smaller in width in the second diagonal direction than the second opening.

An end of the second low refraction layer may cover an end of the first low refraction layer in the first diagonal direction.

An end of the second low refraction layer may be on an upper surface of the first low refraction layer in the second diagonal direction.

The first diagonal direction and the second diagonal direction may be perpendicular to each other.

The first opening may be smaller in width in the first diagonal direction than the second opening.

The second opening may be smaller in width in the second diagonal direction than the first opening.

The display device may include a plurality of pixels on the substrate. The plurality of pixels may include a first color pixel, a second color pixel, and a third color pixel. The first electrode, the pixel opening, the first opening, and the second opening may be on a corresponding one of the plurality of pixels.

A refractive index of the second low refraction layer may be greater than a refractive index of the first low refraction layer. A refractive index of the high refraction layer may be greater than a refractive index of the second low refraction layer.

An embodiment of the present disclosure provides a display device including: a substrate; a transistor on the substrate; a first electrode electrically connected to the transistor; a pixel defining layer on the first electrode, the pixel defining layer including a pixel opening overlapping the first electrode; an emission layer and a second electrode overlapping the first electrode; a touch electrode on the second electrode; a first low refraction layer and a second low refraction layer overlapping the touch electrode; and a high refraction layer on the second low refraction layer. Part of the touch electrode is between the first low refraction layer and the second low refraction layer. The first low refraction layer includes a first opening. The second low refraction layer includes a second opening. The first opening and the second opening have a circular shape or an oval shape in a plan view.

A refractive index of the second low refraction layer may be greater than a refractive index of the first low refraction layer.

The first low refraction layer and the second low refraction layer may include an organic material.

The display device may further include: an encapsulation layer on the second electrode; and a first inorganic insulating layer on the encapsulation layer.

The second opening may be smaller in width in a first diagonal direction than the first opening. The first opening may be smaller in width in a second diagonal direction than the second opening.

An end of the second low refraction layer may cover an end of the first low refraction layer in the first diagonal direction. An end of the second low refraction layer may be on an upper surface of the first low refraction layer in the second diagonal direction.

The first opening may be smaller in width in a first diagonal direction than the second opening. The second opening may be smaller in width in a second diagonal direction than the first opening.

The display device may further include a light blocking layer between a first touch insulating layer and the high refraction layer.

According to one or more embodiments of the present disclosure, light output efficiency and display quality of the display device may be improved.

DETAILED DESCRIPTION

Figure 1:
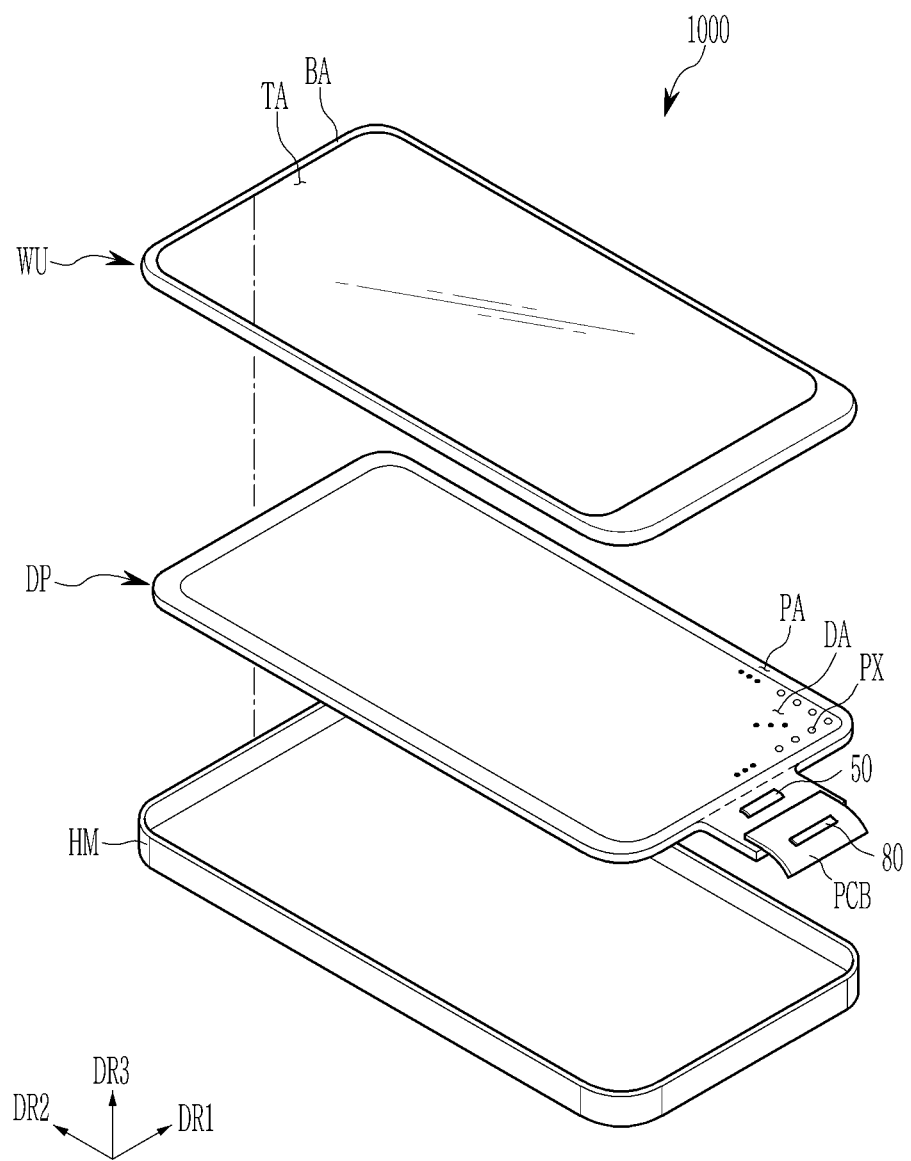
FIG. 1 shows an exploded perspective view of a display device according to one or more embodiments.

The present disclosure will now be described more fully hereinafter with reference to the accompanying drawings, in which embodiments of the disclosure are shown. As those skilled in the art would realize, the described embodiments may be modified in various suitable ways, all without departing from the spirit or scope of the present disclosure.

The terminology used herein is for the purpose of describing particular example embodiments only and is not intended to limit the example embodiments described herein.

Parts that are irrelevant to the description may be omitted to clearly describe the present disclosure. Like reference numerals in the drawings denote like elements throughout, and duplicative descriptions thereof may not be provided.

As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

The size and thickness of each configuration shown in the drawings are shown for better understanding and ease of description, but the present disclosure is not limited thereto. In the drawings, the thickness of layers, films, panels, regions, etc., may be exaggerated for clarity. The thicknesses of some layers and areas may be exaggerated for convenience of explanation.

It will be understood that when an element such as a layer, film, region, or substrate is referred to as being "on" another element, it can be directly on the other element or one or more intervening elements may also be present. In contrast, when an element is referred to as being "directly on" another element, there are no intervening elements present. The word "on" or "above" refers to being positioned on or below the object portion, and does not necessarily refer to positioned on the upper side of the object portion based on a gravitational direction.

Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value.

Unless explicitly described to the contrary, the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

The phrase "in a plan view" refers to viewing an object portion from the top, and the phrase "in a cross-sectional view" refers to viewing a cross-section of which the object portion is vertically cut from the side.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

A display device according to one or more embodiments will now be described with reference to FIGS. 1-3B. FIG. 1 shows an exploded perspective view of a display device according to one or more embodiments, FIG. 2 shows a cross-sectional view of a display device according to one or more embodiments, FIG. 3A shows a top plan view of some constituent elements of a display panel according to one or more embodiments, and FIG. 3B shows a circuit diagram of a display device according to one or more embodiments.

Figure 2:
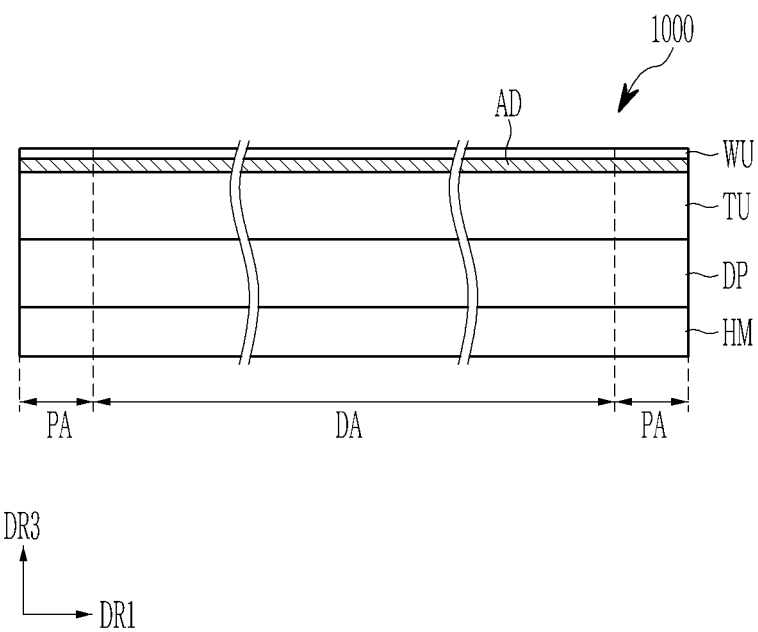
FIG. 2 shows a cross-sectional view of a display device according to one or more embodiments.
Figure 3A:
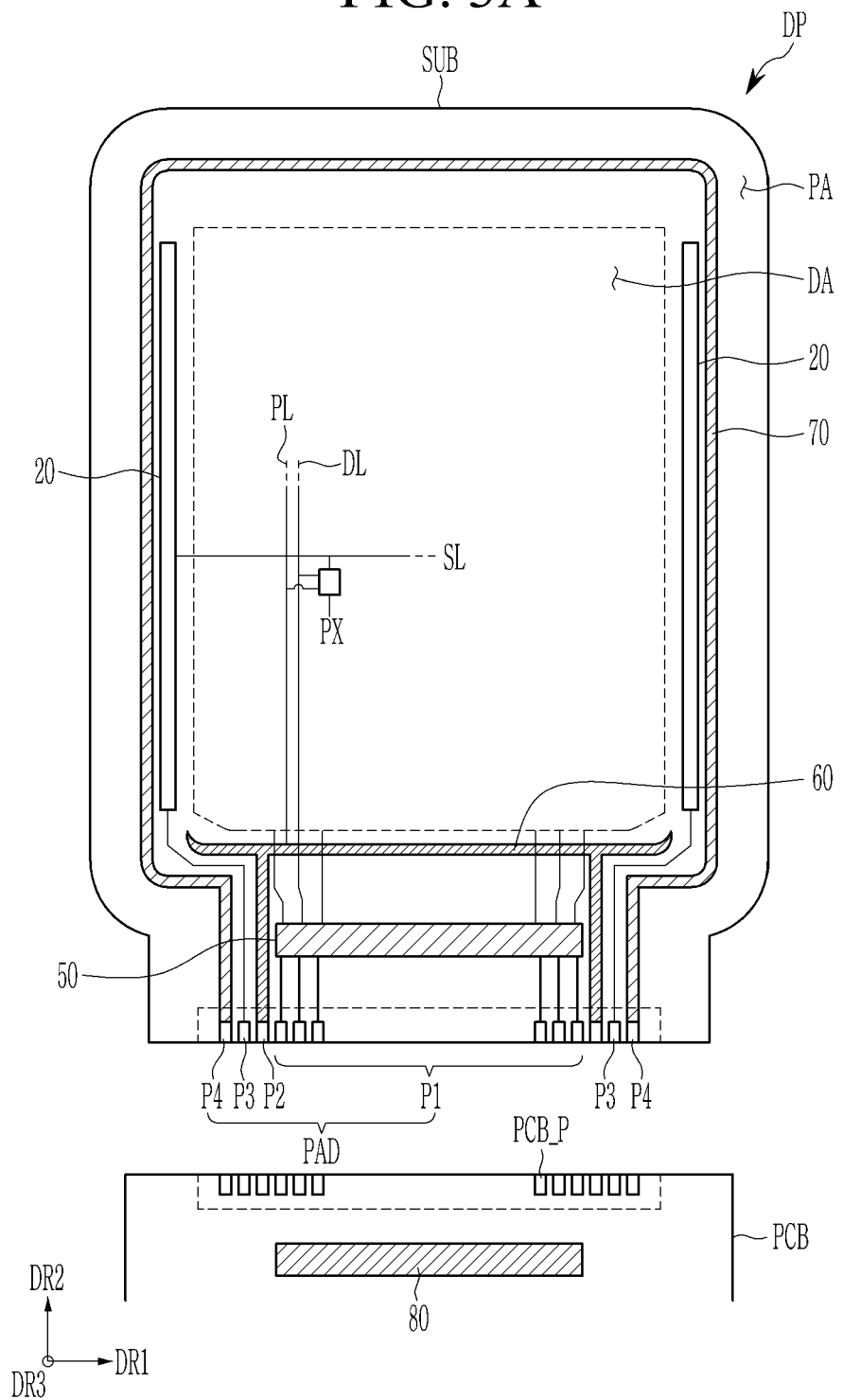
FIG. 3A shows a top plan view of some constituent elements of a display panel according to one or more embodiments.
Figure 3B:
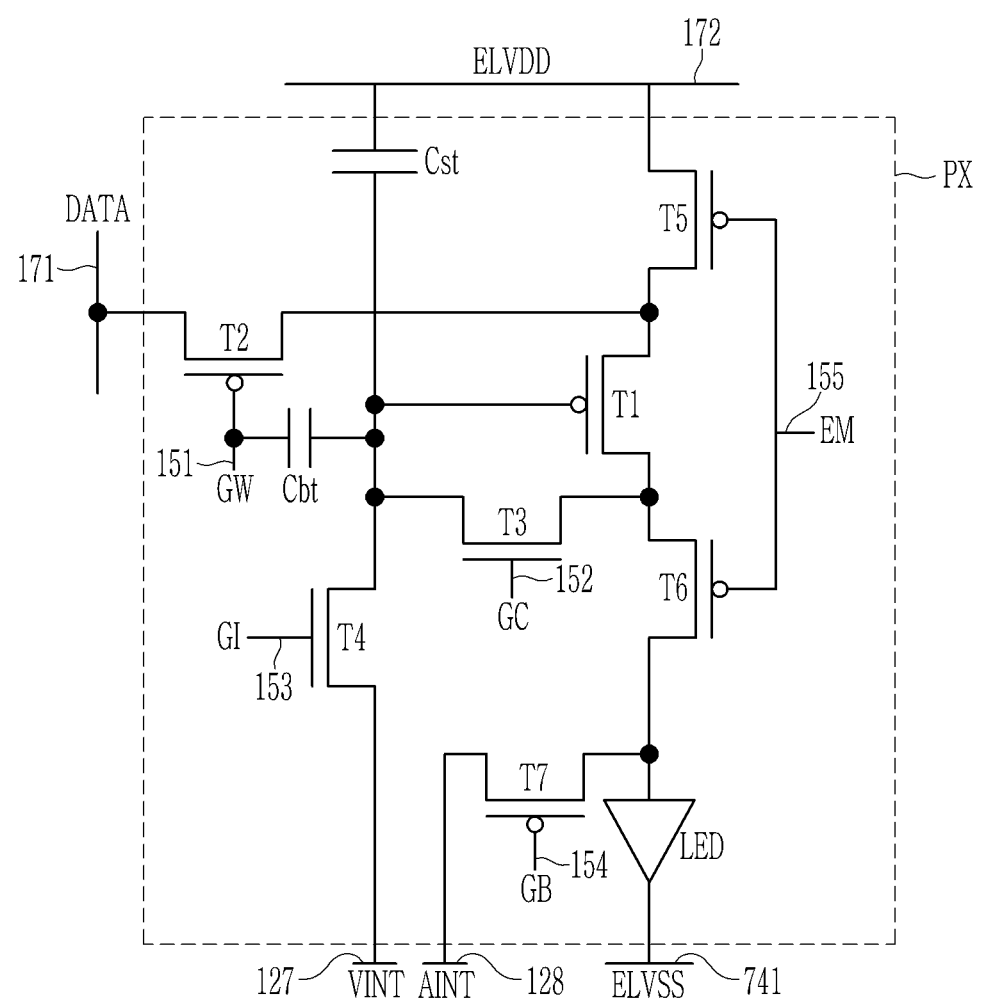
FIG. 3B shows a circuit diagram of a display device according to one or more embodiments.

Referring to FIG. 1 and FIG. 2, the display device 1000 displays images in a third direction DR3 on a plane defined by a first direction DR1 and a second direction DR2. A front side (or a top side) and a rear side (or a bottom side) of respective members are separated or spaced from each other in the third direction DR3. Directions indicated by the first to third directions (the first direction DR1, the second direction DR2, and the third direction DR3) are spatially relative concepts and may be changed into other suitable directions.

The display device 1000 includes a cover window (WU), a display panel (DP), and a housing member (HM). In the illustrated embodiment, the display device 1000 may be configured or formed by combining the cover window (WU), the display panel (DP), and the housing member (HM).

The cover window (WU) is disposed on the display panel (DP) to protect the display panel (DP). The cover window (WU) may include a transmission area (TA) and a blocking area (BA). The transmission area (TA) is an optically transparent region, and it may be a region for transmitting light. The blocking area (BA) may have relatively low light transmittance, compared to the transmission area (TA). The blocking area (BA) defines a shape of the transmission area (TA). The blocking area (BA) may be around (e.g., surround) the transmission area (TA). The blocking area (BA) may express a color (e.g., a predetermined color). The blocking area (BA) may overlap (e.g., overlap in a plan view) the non-display area (PA) of the display panel (DP) to prevent or substantially prevent the non-display area (PA) from being visible from the outside.

The display panel (DP) may be a flat rigid display panel, or without being limited to it, the display panel (DP) may be a flexible display panel. The display panel according to an embodiment of the present disclosure may be an emissive display panel, and is not limited to a specific type. For example, the display panel may be an organic light emitting panel or a quantum dot light emitting display panel. An emission layer of the organic light emitting panel may be an organic light emitting material. The emission layer of the quantum dot light emitting display panel may include a quantum dot and a quantum rod. Hereinafter, the display panel will be described as an organic light emitting panel.

The display panel (DP) displays an image on the front side. The front side of the display panel (DP) includes a display area (DA) and a non-display area (PA). The image is displayed in the display area (DA). The non-display area (PA) may be around (e.g., surround) the display area (DA).

The display panel (DP) may include a plurality of pixels PX positioned in the display area (DA). The pixels PX may display or emit light in response to an electrical signal. Light displayed or emitted by the pixels PX may realize or provide images. A number of transistors and capacitors included in a pixel PX and a connection relationship thereof may be changed in various suitable ways.

The display panel (DP) extends from the display area (DA) and includes a non-display area (PA) in which a plurality of signal lines and pad units are positioned. A data driver 50 may be positioned in the non-display area (PA). According to an embodiment, the pad unit of the non-display area (PA) may be connected (e.g., electrically connected) to a printed circuit board (PCB) including a driving chip 80, which will be described with reference to FIG. 3. As shown in FIG. 2, an adhesive layer (AD) for combining the display panel (DP) and the cover window (WU) may be positioned between the display panel (DP) and the cover window (WU). The adhesive layer (AD) may be omitted in one or more other embodiments.

In one or more embodiments, as shown in FIG. 2, a touch sensing unit (TU) may be positioned between the display panel (DP) and the cover window (WU). The touch sensing unit (TU) may be disposed on the display panel (DP) for a touchscreen function of the display device 1000. The touch sensing unit (TU) may be integrally formed on the display panel (DP).

The touch sensing unit (TU) may include a touch electrode with various suitable patterns, and may be a resistive type or a capacitive type. The touch sensing unit (TU) may include a touch sensing area for sensing a touch and a touch peripheral area around (e.g., surrounding) the touch sensing area.

The housing member (HM) is disposed on a lower side of the display panel (DP). The housing member (HM) is combined with the cover window (WU) to configure or to form an exterior of the display device 1000. The housing member (HM) may include a material with relatively high rigidity. For example, the housing member (HM) may include a plurality of frames and/or plates made of glass, plastic, or metal. The housing member (HM) provides a receiving space (e.g., a predetermined receiving space). The display panel (DP) may be received in the receiving space to be protected from external impacts.

Referring to FIG. 3A, the display panel (DP) includes a substrate (SUB) including a display area (DA) and a non-display area (PA). The non-display area (PA) may be defined along the edge of the display area (DA).

The display panel (DP) includes a plurality of pixels PX. A plurality of pixels (PX) may be disposed in the display area (DA) of the substrate (SUB). The respective pixels (PX) include a light-emitting device and a driving circuit unit connected to the same. The respective pixels (PX) may, for example, emit red light, green light, blue light, or white light, and may, for example, include an organic light emitting diode. However, the present disclosure is not limited thereto.

The display panel (DP) may include a plurality of signal lines and pad units. A plurality of signal lines may include a scan line (SL) extending in the first direction DR1, a data line (DL) extending in the second direction DR2, and a driving voltage line (PL) extending in the second direction DR2.

The scan driver 20 generates a scan signal and transmits it to the respective pixels PX through the scan line (SL). According to an embodiment, the scan driver 20 may be disposed on a left side of the display area (DA) and/or a right side of the display area (DA). The present specification may describe a configuration in which the scan driver 20 is disposed on respective sides (e.g., opposite sides) of the substrate (SUB), but the scan driver may be disposed on one side of the substrate (SUB) according to another embodiment.

The pad unit (PAD) is disposed at one end of the display panel (DP), and includes a plurality of terminals (a terminal P1, a terminal P2, a terminal P3, and a terminal P4). The pad unit (PAD) may not be covered by an insulating layer but may be exposed to be connected (e.g., electrically connected) to the printed circuit board (PCB). The pad unit (PAD) may be connected (e.g., electrically connected) to the pad unit (PCB_P) of the printed circuit board (PCB). The printed circuit board (PCB) may transmit a signal of an IC driving chip 80 or a power voltage to the pad unit (PAD).

The controller converts a plurality of image signals transmitted from the outside into a plurality of image data signals, and transmits the converted signals to the data driver 50 through the terminal P1. Further, the controller may receive a vertical synchronization signal, a horizontal synchronizing signal, and a clock signal, may generate a control signal for controlling the scan driver 20 and the data driver 50, and may transmit the control signal to elements through the terminals P3 and P1. The controller transmits a driving voltage (ELVDD) to the driving voltage supply wire 60 through the terminal P2. The controller also transmits a common voltage (ELVSS) to the respective common voltage supply wires 70 through the terminal P4.

The data driver 50 is disposed in the non-display area (PA), and it generates a data signal and transmits the data signal to the respective pixels PX. The data driver 50 may be disposed on one side of the display panel (DP), and for example, it may be disposed between the pad unit (PAD) and the display area (DA).

The driving voltage supply wire 60 is disposed in the non-display area (PA). For example, the driving voltage supply wire 60 may be disposed between the data driver 50 and the display area (DA). The driving voltage supply wire 60 provides the driving voltage (ELVDD) to the pixels PX. The driving voltage supply wire 60 is disposed in the first direction DR1, and the driving voltage supply wire 60 may be connected to a plurality of driving voltage lines (PL) disposed in the second direction DR2.

The common voltage supply wire 70 is disposed in the non-display area (PA). The common voltage supply wire 70 may surround the substrate (SUB). The common voltage supply wire 70 transmits the common voltage (ELVSS) to one electrode (e.g., a second electrode) of the light-emitting device included in the pixel PX.

An example of a plurality of transistors included in a pixel PX (e.g., a single pixel PX) will now be described with reference to FIG. 3B.

As shown in FIG. 3B, a pixel PX of a display device according to an embodiment includes a plurality of transistors (a driving transistor T1, a second transistor T2, a third transistor T3, a fourth transistor T4, a fifth transistor T5, a sixth transistor T6, and a seventh transistor T7) connected to a plurality of wires (a first initialization voltage line 127, a second initialization voltage line 128, a first scan signal line 151, a second scan signal line 152, an initialization control line 153, a bypass control line 154, an emission control line 155, a data line 171, a driving voltage line 172, and a common voltage line 741), a storage capacitor (Cst), a boost capacitor (Cbt), and a light emitting diode (LED).

A plurality of wires 127, 128, 151, 152, 153, 154, 155, 171, 172, and 741 are connected to the pixel PX. The plurality of wires include a first initialization voltage line 127, a second initialization voltage line 128, a first scan signal line 151, a second scan signal line 152, an initialization control line 153, a bypass control line 154, an emission control line 155, a data line 171, a driving voltage line 172, and a common voltage line 741.

The first scan signal line 151 is connected to a gate driver and transmits the first scan signal (GW) to the second transistor T2. A voltage with an opposite polarity to the voltage applied to the first scan signal line 151 may be applied to the second scan signal line 152 at the same time as the signal of the first scan signal line 151. For example, when a voltage with a negative polarity is applied to the first scan signal line 151, a voltage with a positive polarity may be applied to the second scan signal line 152. The second scan signal line 152 transmits the second scan signal (GC) to the third transistor T3.

The initialization control line 153 transmits an initialization control signal (GI) to the fourth transistor T4. The bypass control line 154 transmits a bypass signal (GB) to the seventh transistor T7. The bypass control line 154 may be configured with a previous-stage first scan signal line 151. The emission control line 155 transmits an emission control signal (EM) to the fifth transistor T5 and the sixth transistor T6.

The data line 171 transmits the data voltage (DATA) generated by a data driver, and luminance of light emitted by the light emitting diode (LED) is changed according to the data voltage (DATA) applied to the pixel PX.

The driving voltage line 172 applies the driving voltage (ELVDD). The first initialization voltage line 127 transmits the first initialization voltage (VINT), and the second initialization voltage line 128 transmits the second initialization voltage (AINT). The common voltage line 741 applies the common voltage (ELVSS) to the cathode of the light emitting diode (LED). In the illustrated embodiment, the voltages applied to the driving voltage line 172, the first and second initialization voltage lines 127 and 128, and the common voltage line 741 may be constant.

A plurality of transistors may include a driving transistor T1, a second transistor T2, a third transistor T3, a fourth transistor T4, a fifth transistor T5, a sixth transistor T6, and a seventh transistor T7. The plurality of transistors may include an oxide transistor including an oxide semiconductor and a silicon transistor including a polycrystalline silicon semiconductor. For example, the third transistor T3 and the fourth transistor T4 may be made of oxide transistors, and the driving transistor T1, the second transistor T2, the fifth transistor T5, the sixth transistor T6, and the seventh transistor T7 may be made of silicon transistors. However, the present disclosure is not limited thereto, and all of the plurality of transistors may be made of silicon transistors.

Although a pixel PX has been described as including seven transistors (T1 to T7), one storage capacitor Cst, and one boost capacitor (Cbt), the present disclosure is not limited thereto. For example, the number of transistors and capacitors and their connection relationship may be changed in various suitable ways.

Figure 4A:
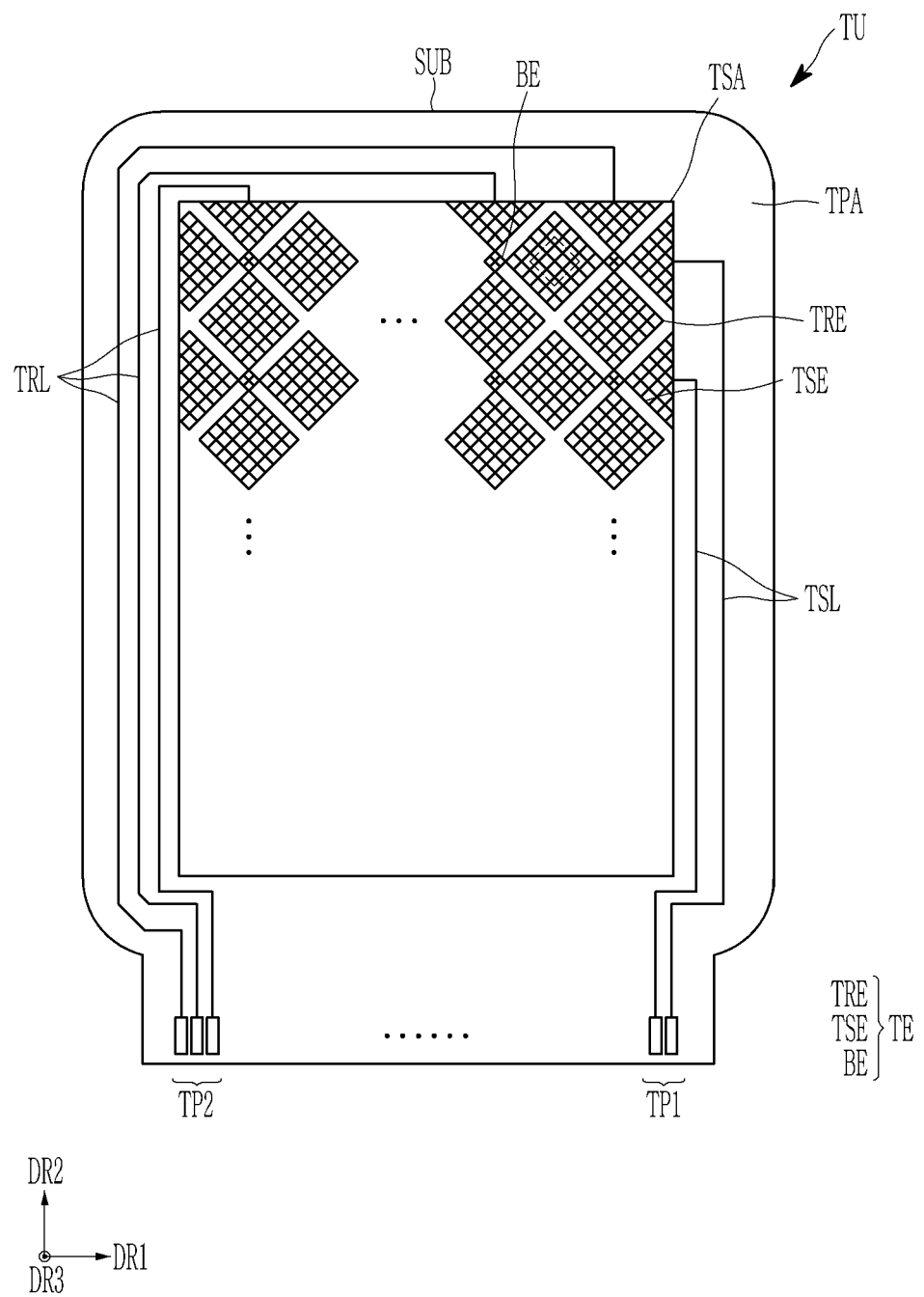
FIG. 4A shows a top plan view of a touch sensing unit according to one or more embodiments.
Figure 4B:
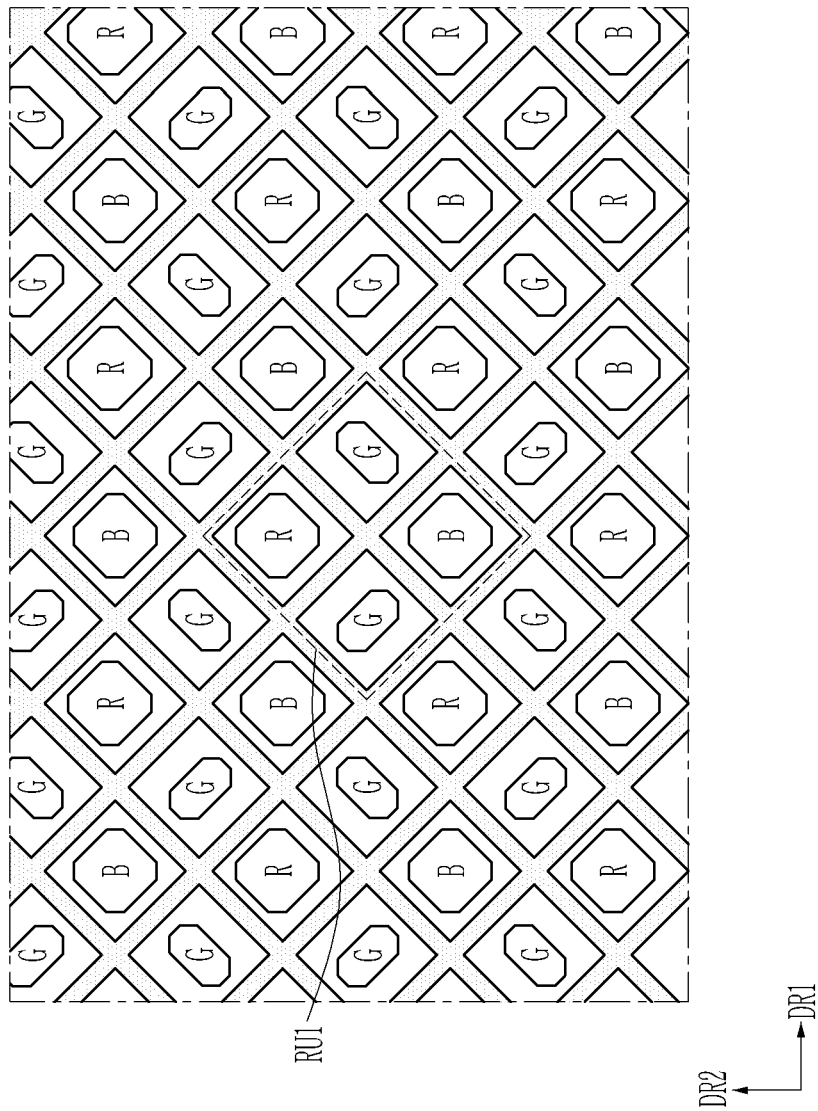
FIG. 4B shows a touch sensing unit and a pixel of a display panel according to one or more embodiments.

A touch sensing unit will now be described with reference to FIG. 4A and FIG. 4B. FIG. 4A shows a top plan view of a touch sensing unit according to one or more embodiments, and FIG. 4B shows a touch sensing unit and a pixel of a display panel according to one or more embodiments.

Referring to FIG. 4A, the touch sensing unit (TU) includes a touch sensing area (TSA) for sensing a touch of a user and a touch peripheral area (TPA) disposed around the touch sensing area (TSA). The touch sensing area (TSA) may overlap (e.g., overlap in a plan view) the display area (DA) of the display panel (DP), and the touch peripheral area (TPA) may overlap (e.g., overlap in a plan view) the non-display area (PA) of the display panel (DP).

The touch electrodes (TE) may be disposed in the touch sensing area (TSA). The touch electrodes (TE) may include sensing electrodes (TSE) connected (e.g., electrically connected) in the first direction DR1, and driving electrodes (TRE) connected (e.g., electrically connected) in the second direction DR2. The present specification describes an embodiment in which the touch electrode (TE) including the sensing electrode (TSE) and the driving electrode (TRE) has a diamond shape in a plan view, but is not limited thereto. The touch electrode (TE) may have a mesh shape as shown in FIG. 4A.

To prevent the sensing electrodes (TSE) and the driving electrodes (TRE) from being short circuited in their traversing regions (e.g., crossing regions), the driving electrodes (TRE) that are adjacent to each other in the second direction DR2 may be connected (e.g., electrically connected) to each other through the bridge electrode (BE). In this case, the driving electrodes (TRE) and the sensing electrodes (TSE) are disposed at a same layer, and the bridge electrode (BE) may be disposed at a layer that is different from the layers of the driving electrodes (TRE) and the sensing electrodes (TSE).

Touch lines (TSL and TRL) may be disposed in the touch peripheral area (TPA). The touch lines (TSL and TRL) may include a sensing line (TSL) connected to the sensing electrode (TSE) and a driving line (TRL) connected to the driving electrode (TRE). The sensing line (TSL) may be connected to the first touch pad TP1, and the driving line (TRL) may be connected to the second touch pad TP2.

The touch electrodes (TE) may be driven as a mutual capacitance type or a magnetic capacitance type.

FIG. 4B shows a top plan view of a disposal relationship (e.g., a spatial relationship) of pixels of FIG. 3 and a touch electrode of FIG. 4A. Referring to FIG. 4B, a plurality of pixels may include a first color pixel (R), a second color pixel (G), and a third color pixel (B). According to an embodiment, the first color may be red, the second color may be green, and the third color may be blue, but the present disclosure is not limited thereto.

According to an embodiment, a white gray level may be expressed with one adjacent first color pixel (R), two second color pixels (G), and one third color pixel (B) as one repetition unit RU1.

The number of the first color pixels (R) may be equal to the number of third color pixels (B) on the display panel (DP). The number of the second color pixels (G) may be double the number of the first color pixels (R) and may be double the number of the third color pixels (B) on the display panel (DP). In addition, the number of the second color pixels (G) may be equal to a sum of the number of the first color pixels (R) and the number of the third pixels (B) on the display panel (DP).

Figure 5A:
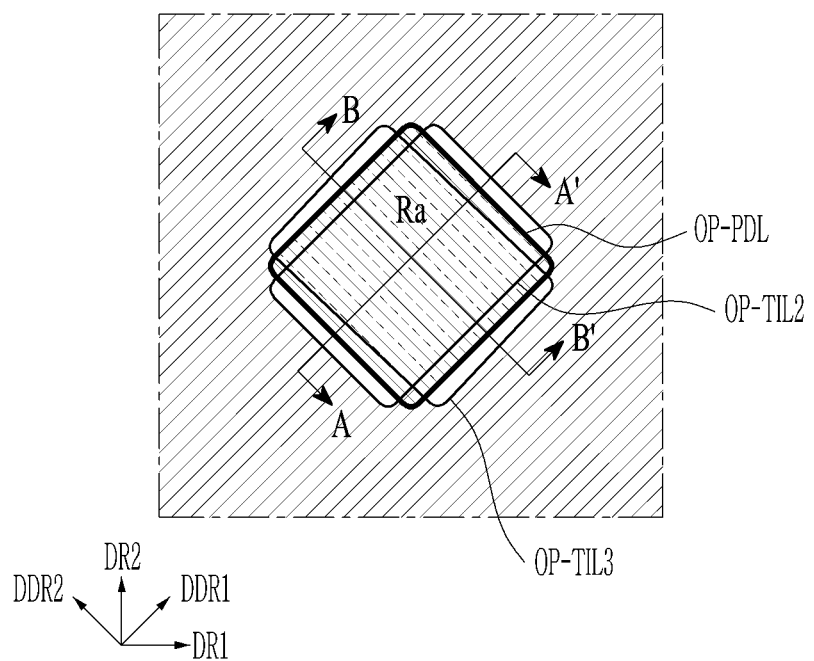
FIG. 5A and FIG. 5B show a top plan view of a first color pixel according to one or more embodiments.
Figure 5B:
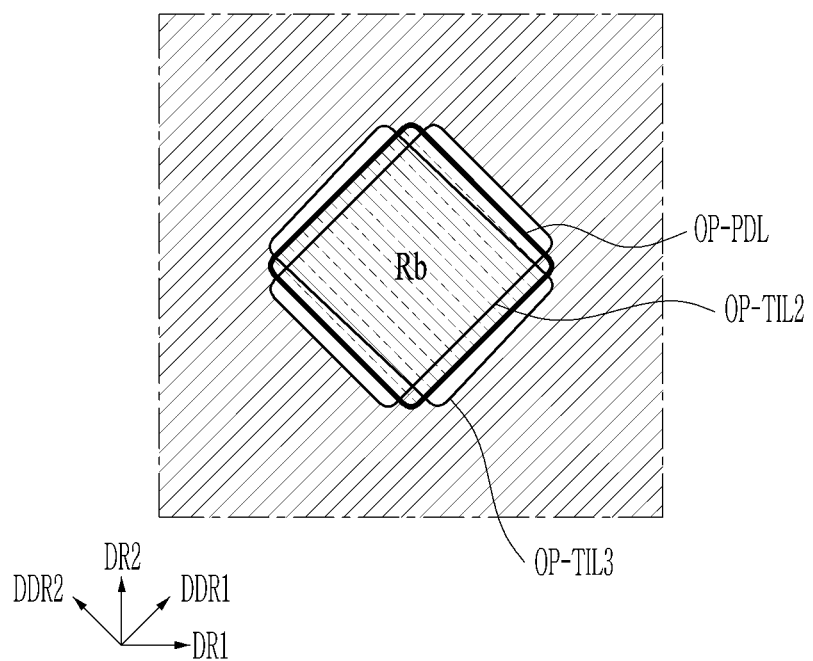

FIG. 5A and FIG. 5B illustrate an embodiment in which the first color pixel has a rhombus shape, but the present disclosure is not limited thereto, and as shown in FIG. 4B, the first color pixel (R), the second color pixel (G), and the third color pixel (B) may be positioned to be a polygon (e.g., an octagon that is close to a rhombus) in a plan view. The present disclosure is not limited thereto, and the first color pixel (R), the second color pixel (G), and the third color pixel (B) may have a rectangular or square shape, and they may also have other polygonal shapes, a circular shape, and an oval shape in addition to the quadrangular shape. Further, the shape of the first color pixel (R), the shape of the second color pixel (G), and the shape of the third color pixel (B) may be different from each other.

FIG. 4B illustrates that the first color pixel (R) and the third color pixel (B) have the same size as each other, but the present disclosure is not limited thereto. That is, in a plan view, the first color pixel (R), the second color pixel (G), and the third color pixel (B) may have different sizes from each other. For example, in a plan view, the first color pixel (R) may be larger than the second color pixel (G), and the third color pixel (B) may be larger than the second color pixel (G). Further, in a plan view, the first color pixel (R) and the third color pixel (B) may have substantially the same size as each other or the first color pixel (R) may be smaller than the third color pixel (B).

The touch electrode (TE) may have a mesh shape, and the first to third color pixels (the first color pixel R, the second color pixel G, and the third color pixel B) may be disposed among the mesh shape. By this, reduction of opening regions of the first to third color pixels R, G, and B by the touch electrode (TE) may be prevented or substantially prevented.

Figure 5C:
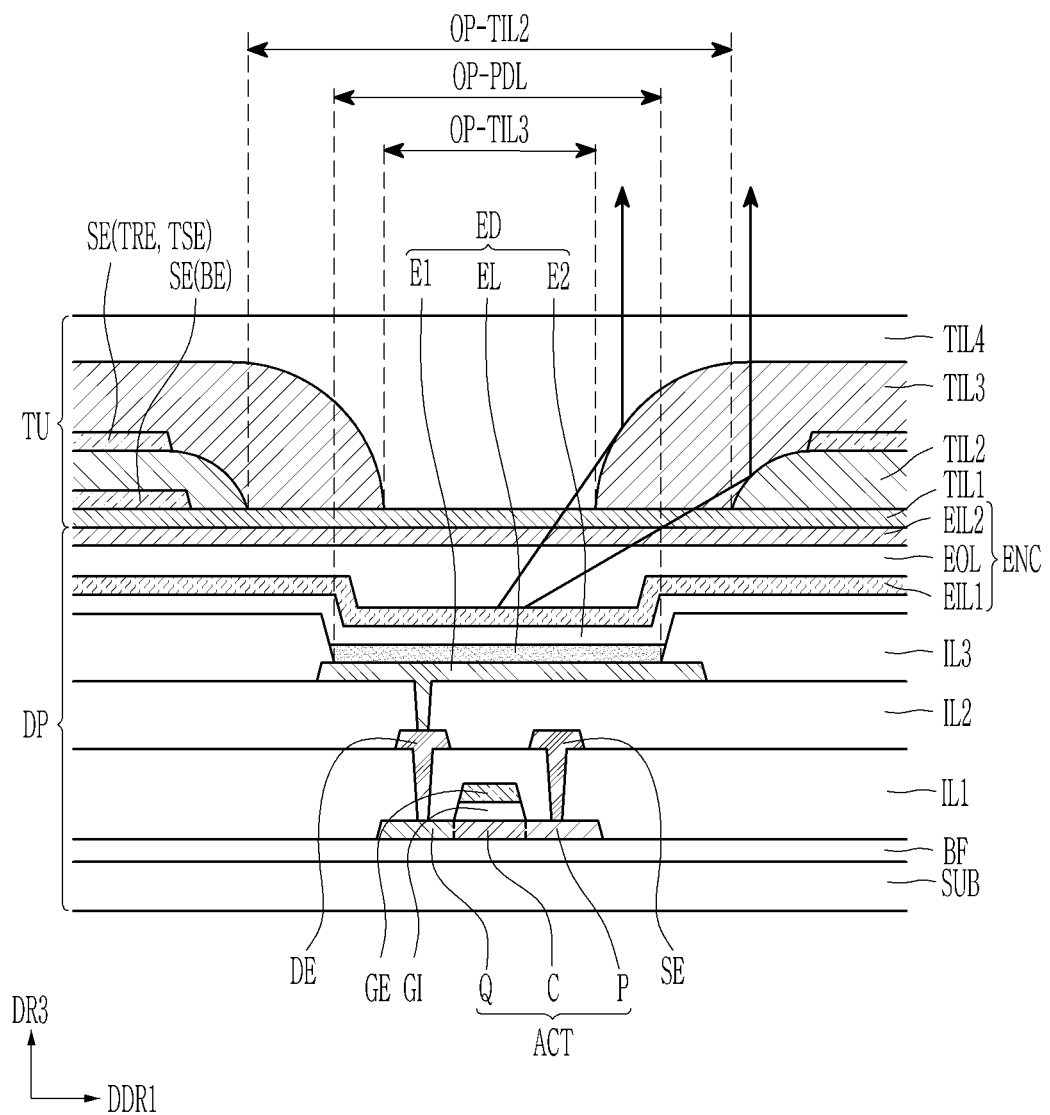
FIG. 5C shows a cross-sectional view taken along the line A-A' of FIG. 5A.
Figure 5D:
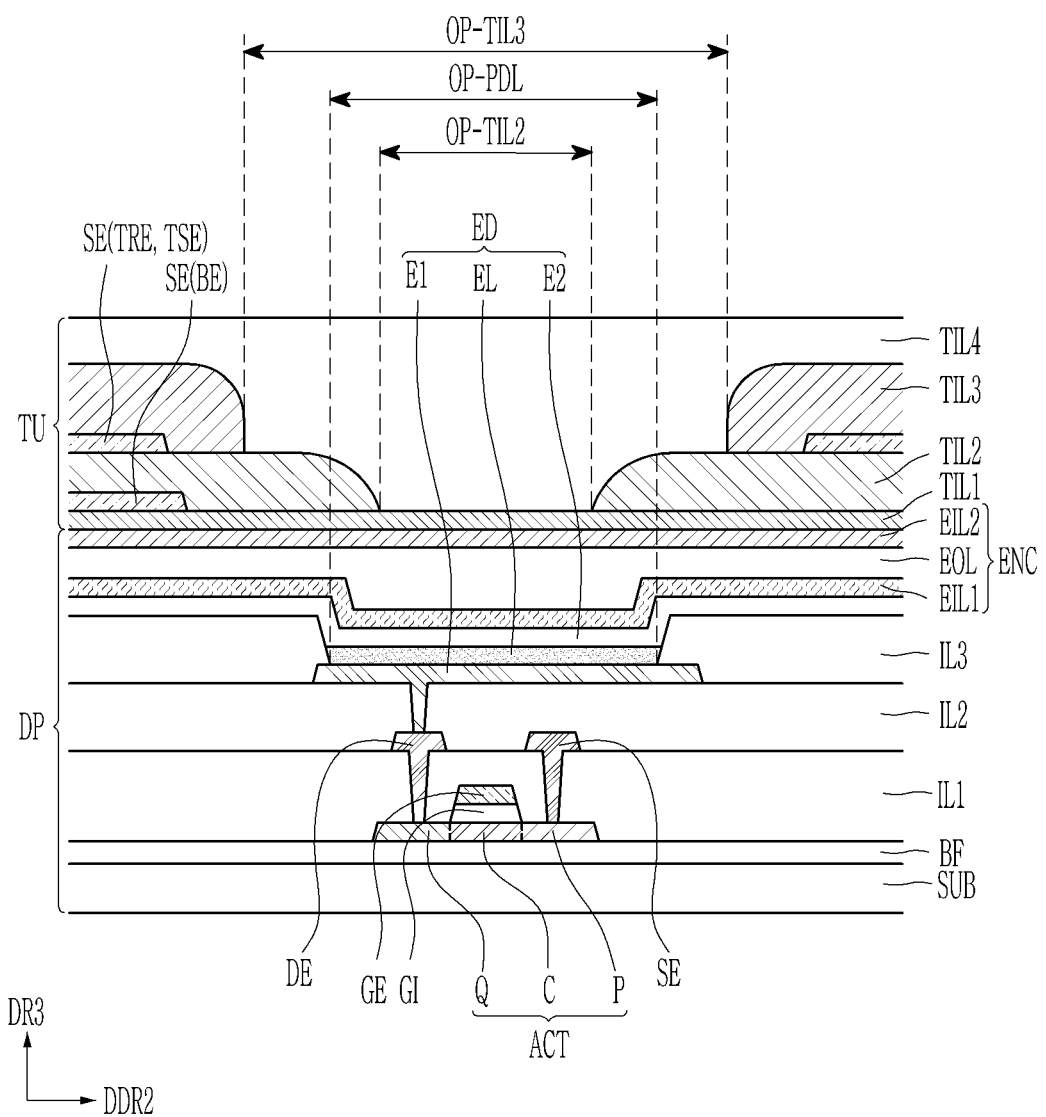
FIG. 5D shows a cross-sectional view taken along the line B-B' of FIG. 5A.

A relationship between one pixel and a touch sensing unit according to one or more embodiments will now be described with reference to FIGS. 5A-5D. FIG. 5A and FIG. 5B show a top plan view of a first color pixel, FIG. 5C shows a cross-sectional view taken along the line A-A' of FIG. 5A, and FIG. 5D shows a cross-sectional view taken along the line B-B' of FIG. 5A. In more detail, FIG. 5C illustrates a cross-section taken along the line A-A', cut in the first diagonal direction in FIG. 5A, and FIG. 5D illustrates a cross-section taken along the line B-B', cut in the second diagonal direction. The first diagonal direction DDR1 refers to a direction inclined in the first direction DR1 and the second direction DR2 and traversing a first quadrant and a third quadrant. The second diagonal direction DDR2 refers to a direction inclined in the first direction DR1 and the second direction DR2 and traversing a second quadrant and a fourth quadrant. The first diagonal direction DDR1 and the second diagonal direction DDR2 may be orthogonal to each other.

Cross-sections of a display panel (DP) and a touch sensing unit (TU) cut in the first diagonal direction DDR1 will now be described with reference to FIG. 5A and FIG. 5C.

The substrate (SUB) may include an inorganic insulating material such as glass or an organic insulating material such as plastic like a polyimide (PI). The substrate (SUB) may be a single layer structure or a multilayer structure. The substrate (SUB) may have a structure in which at least one base layer including sequentially stacked polymer resins and at least one inorganic layer are alternately stacked.

The substrate (SUB) may have various degrees of flexibility. The substrate (SUB) may be a rigid substrate or a flexible substrate that may be capable of being bent, folded, or rolled.

A buffer layer (BF) may be positioned on the substrate (SUB). The buffer layer (BF) may prevent or reduce characteristic degradation of the semiconductor layer (ACT) and may ease a stress by blocking transmission of impurities to an upper layer of the buffer layer (BF), particularly the semiconductor layer (ACT), from the substrate (SUB). The buffer layer (BF) may include an inorganic insulating material such as a silicon nitride or a silicon oxide, or an organic insulating material. Part or the entire buffer layer (BF) may be omitted.

A semiconductor layer (ACT) is positioned on the buffer layer (BF). The semiconductor layer (ACT) may include at least one of polysilicon and an oxide semiconductor. The semiconductor layer (ACT) includes a channel region (C), a first region (P), and a second region (Q). The first region (P) and the second region (Q) are disposed on respective sides (e.g., opposite sides) of the channel region (C). The channel region (C) may include a semiconductor doped with a small amount of impurities or may include a semiconductor that is not doped with impurities, and the first region (P) and the second region (Q) may include a semiconductor doped with a large amount of impurities compared to the channel region (C). The semiconductor layer (ACT) may be made of an oxide semiconductor that is vulnerable to external conditions such as a high temperature, and in this case, an individual protection layer for protecting the oxide semiconductor material may be added.

A first gate insulating layer (GI) is positioned on the semiconductor layer (ACT). The first gate insulating layer (GI) may be a single layer structure or a multilayer structure including at least one of a silicon oxide ($SiO_x$), a silicon nitride ($SiN_x$), and a silicon oxynitride ($SiO_xN_y$).

A gate electrode (GE) is positioned on the first gate insulating layer (GI). The gate electrode (GE) may be a single layer structure or a multilayer structure in which a metal film including one of copper (Cu), a copper alloy, aluminum (Al), an aluminum alloy, molybdenum (Mo), and a molybdenum alloy is stacked. The gate electrode (GE) may overlap the channel region (C) of the semiconductor layer (ACT).

A first insulating layer (IL1) is positioned on the gate electrode (GE). The first insulating layer (IL1) may be a single layer structure or a multilayer structure including at least one of a silicon oxide ($SiO_x$), a silicon nitride ($SiN_x$), and a silicon oxynitride ($SiO_xN_y$).

A source electrode (SE) and a drain electrode (DE) are positioned on the first insulating layer (IL1). The source electrode (SE) and the drain electrode (DE) are connected to the first region (P) and the second region (Q) of the semiconductor layer (ACT) through respective contact holes.

The source electrode (SE) and the drain electrode (DE) may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and they may be a single layer or multilayer structure including the same.

A second insulating layer (IL2) is positioned on the source electrode (SE) and the drain electrode (DE). The second insulating layer (IL2) may include an organic insulating material including a general purpose polymer such as polymethyl methacrylate or polystyrene, a polymer derivative having a phenol-based group, an acryl-based polymer, an imide-based polymer, a polyimide, an acryl-based polymer, and a siloxane-based polymer.

A first electrode (E1) is positioned on the second insulating layer (IL2). The first electrode (E1) is connected to the drain electrode (DE) through a contact hole of the second insulating layer (IL2) (e.g., a contact hole extending through or penetrating the second insulating layer (IL2)). The first electrode (E1) may include a metal such as silver (Ag), lithium (Li), calcium (Ca), aluminum (Al), magnesium (Mg), or gold (Au), and may include a transparent conductive oxide (TCO) such as an indium tin oxide (ITO) or an indium zinc oxide (IZO). The first electrode (E1) may be made of a single layer structure including a metal material or a transparent conductive oxide, or a multilayer structure including the same. For example, the first electrode (E1) may have a triple layer structure of indium tin oxide (ITO)/silver (Ag)/indium tin oxide (ITO).

The transistor formed of a gate electrode (GE), a semiconductor layer (ACT), a source electrode (SE), and a drain electrode (DE) is connected to the first electrode (E1) and supplies a current to the light-emitting device (ED).

A pixel defining layer (IL3) is positioned on the first electrode E1. The pixel defining layer (IL3) includes a pixel opening (OP-PDL) overlapping (e.g., overlapping in a plan view) at least part of the first electrode E1 and defining a light emitting region.

The pixel opening (OP-PDL) may have a planar shape that is substantially similar to the first electrode E1. The pixel opening (OP-PDL) may have a rhombus shape in a plan view or an octagonal shape that is similar to the rhombus, but without being limited thereto, the pixel opening (OP-PDL) may have various shapes such as a quadrangle, a polygon, or a circle.

The pixel defining layer (IL3) may include an organic insulating material including a general purpose polymer such as polymethyl methacrylate or polystyrene, a polymer derivative having a phenol-based group, an acryl-based polymer, an imide-based polymer, a polyimide, an acryl-based polymer, and a siloxane-based polymer.

An emission layer (EL) is positioned on the first electrode (E1) overlapping (e.g., overlapping in a plan view) the pixel opening (OP-PDL). The emission layer (EL) may include an organic material and/or inorganic material. Further, a function layer positioned between the emission layer (EL) and the first electrode (E1) or between the emission layer (EL) and the second electrode (E2) may be further included. The function layer may include at least one of a hole injection layer (HIL), a hole transporting layer (HTL), an electron transporting layer (ETL), and an electron injection layer (EIL).

A second electrode (E2) is positioned on the emission layer (EL). The second electrode (E2) may include a reflective metal including barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), and calcium (Ca), or a transparent conductive oxide (TCO) such as an indium tin oxide (ITO) or an indium zinc oxide (IZO).

The first electrode (E1), the emission layer (EL), and the second electrode (E2) may configure or form a light-emitting device (ED). Here, the first electrode E1 may be an anode that is a hole injecting electrode, and the second electrode (E2) may be a cathode that is an electron injecting electrode. However, the present disclosure is not limited thereto. For example, the first electrode E1 may be a cathode and the second electrode (E2) may be an anode according to a method for driving an emissive display device.

Holes and electrons are injected into the emission layer (EL) from the first electrode E1 and the second electrode (E2), and light is emitted when excitons that are a combination of the injected holes and electrons fall to a ground state from an excited state.

An encapsulation layer (ENC) is positioned on the second electrode (E2). The encapsulation layer (ENC) may cover an upper side of the light-emitting device (ED) and a lateral side thereof to seal the same. The light-emitting device is very weak to moisture and oxygen, so the encapsulation layer (ENC) seals the light-emitting device (ED) to block an inflow of external moisture and oxygen.

The encapsulation layer (ENC) may include a plurality of layers, and may be made of complex layers including an inorganic layer and an organic layer. For example, the encapsulation layer (ENC) may be formed to be a triple layer structure configured by stacking (e.g., sequentially stacking) a first encapsulating inorganic layer (EIL1), an encapsulating organic layer (EOL), and a second encapsulating inorganic layer (EIL2).

The first encapsulating inorganic layer (EIL1) may cover the second electrode (E2). The first encapsulating inorganic layer (EIL1) may prevent or substantially prevent the external moisture or oxygen from permeating into the light-emitting device (ED). For example, the first encapsulating inorganic layer (EIL1) may include a silicon nitride, a silicon oxide, or a combined compound thereof. The first encapsulating inorganic layer (EIL1) may be formed by a deposition process.

The encapsulating organic layer (EOL) may be disposed on the first encapsulating inorganic layer (EIL1) to contact the first encapsulating inorganic layer (EIL1). Curves formed on a top side of the first encapsulating inorganic layer (EIL1) or particles positioned on the first encapsulating inorganic layer (EIL1) are covered by the encapsulating organic layer (EOL), so a surface state of the top side of the first encapsulating inorganic layer (EIL1) may block an influence applied to the constituent elements on the encapsulating organic layer (EOL). The encapsulating organic layer (EOL) may also ease the stress among the contact layers. The encapsulating organic layer (EOL) may include an organic material, and may be formed by a solution process such as a spin coating, a slit coating, or an inkjet process.

The second encapsulating inorganic layer (EIL2) is disposed on the encapsulating organic layer (EOL) to cover the encapsulating organic layer (EOL). The second encapsulating inorganic layer (EIL2) may be more stably positioned on a relatively planar side than is disposed on the first encapsulating inorganic layer (EIL1). The second encapsulating inorganic layer (EIL2) encapsulates the moisture discharged by the encapsulating organic layer (EOL) to prevent or reduce the outflow thereof to the outside. The second encapsulating inorganic layer (EIL2) may include a silicon nitride, a silicon oxide, or a combined compound thereof. The second encapsulating inorganic layer (EIL2) may be formed by a deposition process.

In one or more embodiments, a capping layer positioned between the second electrode (E2) and the encapsulation layer (ENC) may be further included. The capping layer may include an organic material. The capping layer protects the second electrode (E2) from a subsequent process, for example, a sputtering process, and improves light output efficiency of the light-emitting device (ED). The capping layer may have a greater refractive index than the first encapsulating inorganic layer (EIL1).

A first touch insulating layer (TIL1) included by the touch sensing unit (TU) may be positioned on the encapsulation layer (ENC). The first touch insulating layer (TIL1) may overlap (e.g., overlap in a plan view) the substrate (SUB) (e.g., an entire surface of the substrate (SUB)).

The first touch insulating layer (TIL1) may include at least one of the inorganic film and the organic film. The inorganic film may include at least one of the silicon oxide, the silicon nitride, and the silicon oxynitride. The organic film may include a polymer-based material. The first encapsulating inorganic layer (EIL1), the second encapsulating inorganic layer (EIL2), and the first touch insulating layer (TIL1) may be formed of the same material as each other, and for example, they may include the same inorganic material as each other.

Part of the touch electrode (TE) may be positioned on the first touch insulating layer (TIL1). For example, a bridge electrode (BE) that is part of the touch electrode (TE) may be positioned thereon. According to an embodiment that part of the touch electrode (TE) positioned on the first touch insulating layer (TIL1) is the bridge electrode (BE), and without being limited thereto, the part thereof may be a sensing electrode (TSE) or a driving electrode (TRE).

A first low refraction layer (TIL2) may be positioned on the first touch insulating layer (TIL1) and the bridge electrode (BE). For example, the first low refraction layer (TIL2) may contact the first touch insulating layer (TIL1) and the bridge electrode (BE). The first low refraction layer (TIL2) may cover the touch electrode (TE). In one or more embodiments, the bridge electrode (BE) may be between the first touch insulating layer (TIL1) and the first low refraction layer (TIL2).

The first low refraction layer (TIL2) may include a light transmitting organic material with a low refractive index. For example, the first low refraction layer (TIL2) may include at least one of an acrylic resin, a polyimide resin, a polyamide resin, and Alq3[tris(8-hydroxyquinolinato)aluminum]. The first low refraction layer (TIL2) may have a relatively smaller refractive index than the second low refraction layer (TIL3) and the high refraction layer (TIL4). For example, the first low refraction layer (TIL2) may have a refractive index of 1.51 to 1.53.

The first low refraction layer (TIL2) may have a first opening (OL-TIL2). The first opening (OL-TIL2) refers to a portion that is not covered by the first low refraction layer (TIL2). The first opening (OL-TIL2) may overlap (e.g., overlap in a plan view) the pixel opening (OP-PDL).

Part of the touch electrode (TE) may be positioned on the first low refraction layer (TIL2). For example, a sensing electrode (TSE) and a driving electrode (TRE) may be positioned between the first low refraction layer (TIL2) and the second low refraction layer (TIL3). In one or more embodiments, a bridge electrode (BE) is positioned below the first low refraction layer (TIL2), and a sensing electrode (TSE) and a driving electrode (TRE) are positioned on the first low refraction layer (TIL2). However, the present disclosure is not limited thereto. For example, in one or more embodiments a sensing electrode (TSE) and a driving electrode (TRE) are positioned below the first low refraction layer (TIL2), and a bridge electrode (BE) is positioned on the first low refraction layer (TIL2).

A second low refraction layer (TIL3) may be positioned on part of the first low refraction layer (TIL2) and the touch electrode (TE).

The second low refraction layer (TIL3) may include a light transmitting organic material with a low refractive index. For example, the second low refraction layer (TIL3) may include at least one of an acrylic resin, a polyimide resin, a polyamide resin, and Alq3[tris(8-hydroxyquinolinato)aluminum]. The second low refraction layer (TIL3) may have a smaller refractive index than the high refraction layer (TIL4), and may have a greater refractive index than the first low refraction layer (TIL2). For example, the second low refraction layer (TIL3) may have a refractive index of 1.53 to 1.55.

The second low refraction layer (TIL3) may have a second opening (OP-TIL3). The second opening (OP-TIL3) refers to a portion that is not covered by the second low refraction layer (TIL3). The second opening (OP-TIL3) may overlap (e.g., overlap in a plan view) the pixel opening (OP-PDL) and the first opening (OP-TIL2).

A high refraction layer (TIL4) may be positioned on the second low refraction layer (TIL3). The high refraction layer (TIL4) may have a shape overlapping (e.g., overlapping in a plan view) the substrate (SUB) (e.g., the entire surface of the substrate (SUB)).

The high refraction layer (TIL4) may include a light transmitting organic material with a high refractive index. The high refraction layer (TIL4) may have a relatively greater refractive index than the first low refraction layer (TIL2) and the second low refraction layer (TIL3). For example, the refractive index of the high refraction layer (TIL4) may be equal to or greater than 1.61, and for example, it may have a refractive index of 1.61 to 1.80.

The high refraction layer (TIL4) may be positioned in the first opening (OP-TIL2) of the first low refraction layer (TIL2) and the second opening (OP-TIL3) of the second low refraction layer (TIL3). In this instance, the high refraction layer (TIL4) may contact at least one lateral side of the first low refraction layer (TIL2) and the second low refraction layer (TIL3). The high refraction layer (TIL4) may be positioned to cover the upper side of the second low refraction layer (TIL3).

In one or more embodiments, a polarization layer including a linear polarizer and a retarder may be further positioned on the touch sensing unit (TU).

The touch sensing unit (TU) includes a first low refraction layer (TIL2) including a first opening (OP-TIL2), a second low refraction layer (TIL3) including a second opening (OP-TIL3), and a high refraction layer (TIL4) positioned in the first opening (OP-TIL2) and the second opening (OP-TIL3), thereby improving front side visibility and light output efficiency of the display device. At least part of light generated by the light-emitting device (ED) is fully reflected (or totally reflected) at an interface of the first low refraction layer (TIL2) and the second low refraction layer (TIL3), and an interface of the second low refraction layer (TIL3) and the high refraction layer (TIL4).

In more detail, light generated by the emission layer (EL) may emit in many directions, and the light is input to or is incident on the touch sensing unit (TU) with various incident angles. In this instance, at least part of the light that is input to or incident on the high refraction layer (TIL4) of the touch sensing unit (TU) is reflected at the interface of the second low refraction layer (TIL3) and the high refraction layer (TIL4). Particularly, when the incident angle of the light input to or incident on the high refraction layer (TIL4) is greater than a threshold angle (e.g., a critical angle), the input light may be fully reflected at the interface of the second low refraction layer (TIL3) and the high refraction layer (TIL4). That is, as the light input to the high refraction layer (TIL4) with a relatively large refractive index proceeds to the second low refraction layer (TIL3) with a relatively small refractive index, full reflection (or total reflection) may occur at the interface between the second low refraction layer (TIL3) and the high refraction layer (TIL4). According to a similar principle, full reflection may occur at the interface between the first low refraction layer (TIL2) and the second low refraction layer (TIL3).

A pixel opening, a first opening, and a second opening in a first diagonal direction DDR1 will now be described in more detail.

Referring to FIG. 5A and FIG. 5C, the second opening (OP-TIL3), the pixel opening (OP-PDL), and the first opening (OP-TIL2) may have different widths from each other in the first diagonal direction DDR1. For example, the widths in the first diagonal direction DDR1 may increase in order of the second opening (OP-TIL3) to the pixel opening (OP-PDL) to the first opening (OP-TIL2). However, the present disclosure is not limited thereto. For example, according to another embodiment, the pixel opening (OP-PDL) may be smaller (e.g., smaller in the first diagonal direction DDR1) than the second opening (OP-TIL3).

Regarding the cross-section with respect to the first diagonal direction DDR1 as shown in FIG. 5C, the second low refraction layer (TIL3) may have a shape that covers the end of the first low refraction layer (TIL2). The second low refraction layer (TIL3) may overlap (e.g., overlap in a plan view) the pixel opening (OP-PDL). That is, the end of the second low refraction layer (TIL3) may overlap (e.g., overlap in a plan view) at least part of the emission layer (EL).

The end of the first low refraction layer (TIL2) may overlap (e.g., overlap in a plan view) the pixel defining layer (IL3). The first low refraction layer (TIL2) may not overlap (e.g., not overlap in a plan view) the pixel opening (OP-PDL) and the second opening (OP-TIL3).

Referring to FIG. 5A and FIG. 5D, the first opening (OP-TIL2), the pixel opening (OP-PDL), and the second opening (OP-TIL3) may have different widths from each other in the second diagonal direction DDR2. For example, the widths in the second diagonal direction DDR2 may increase in order of the first opening (OP-TIL2) to the pixel opening (OP-PDL) to the second opening (OP-TIL3). However, the present disclosure is not limited thereto. For example, according to another embodiment, the pixel opening (OP-PDL) may be smaller than the first opening (OP-TIL2).

Referring to the cross-section with respect to the second diagonal direction DDR2 as shown in FIG. 5D, the second low refraction layer (TIL3) may not overlap (e.g., not overlap in a plan view) the end of the first low refraction layer (TIL2). The end of the second low refraction layer (TIL3) may be positioned on the upper side of the first low refraction layer (TIL2).

The first low refraction layer (TIL2) may overlap (e.g., overlap in a plan view) the pixel opening (OP-PDL). The end of the first low refraction layer (TIL2) may overlap (e.g., overlap in a plan view) at least part of the emission layer (EL). The end of the second low refraction layer (TIL3) may overlap (e.g., overlap in a plan view) the pixel defining layer (IL3). The second low refraction layer (TIL3) may not overlap (e.g., not overlap in a plan view) the pixel opening (OP-PDL) and the first opening (OP-TIL2).

The touch sensing unit (TU) according to an embodiment may include a first low refraction layer (TIL2) and a second low refraction layer (TIL3). In this instance, the first opening (OP-TIL2) of the first low refraction layer (TIL2) and the second opening (OP-TIL3) of the second low refraction layer (TIL3) may have different widths from each other in the first diagonal direction DDR1 and the second diagonal direction DDR2.

With respect to the first diagonal direction DDR1 according to an embodiment, light discharged by the light-emitting device (ED) may be fully reflected at the interface between the second low refraction layer (TIL3) and the high refraction layer (TIL4). Further, light may be fully reflected at the interface between the first low refraction layer (TIL2) and the second low refraction layer (TIL3).

In addition, with respect to the second diagonal direction DDR2, light discharged by the light-emitting device (ED) may be fully reflected at the interface between the second low refraction layer (TIL3) and the high refraction layer (TIL4). Further, light may be fully reflected at the interface between the first low refraction layer (TIL2) and the high refraction layer (TIL4).

Regarding the display device according to an embodiment, the light output by the light-emitting device is fully reflected at various interfaces and is gathered on the front side of the display device, thereby improving the front-side light output efficiency of the display device. The front-side light outputting efficiency may be improved in the first diagonal direction and the second diagonal direction in a plan view.

The first color pixel according to an embodiment may include a 1-1 color pixel (Ra) shown in FIG. 5A and a 1-2 color pixel (Rb) shown in FIG. 5B.

The 1-1 color pixel (Ra) may overlap (e.g., overlap in a plan view) the first opening (OP-TIL2) and the second opening (OP-TIL3) as shown in FIG. 5A. The first opening (OP-TIL2) according to an embodiment may have a rectangular shape including a long side extending in the first diagonal direction DDR1 and a short side extending in the second diagonal direction DDR2, and the second opening (OP-TIL3) may have a rectangular shape including a long side extending in the second diagonal direction DDR2 and a short side extending in the first diagonal direction DDR1. However, the present disclosure is not limited thereto.

As shown in FIG. 5B, the 1-2 color pixel (Rb) may overlap (e.g., overlap in a plan view) the first opening (OP-TIL2) and the second opening (OP-TIL3). The first opening (OP-TIL2) according to an embodiment may have a rectangular shape including a long side extending in the second diagonal direction DDR2 and a short side extending in the first diagonal direction DDR1, and the second opening (OP-TIL3) may have a rectangular shape including a long side extending in the first diagonal direction DDR1 and a short side extending in the second diagonal direction DDR2, and they are not limited thereto.

In the case of the 1-2 color pixel (Rb) shown in FIG. 5B, its cross-section in the first diagonal direction DDR1 may be like what is shown in FIG. 5D, and the cross-section in the second diagonal direction DDR2 may be like what is shown in FIG. 5C. Therefore, a redundant description thereof may not be repeated.

Shapes of a pixel opening, a first opening, and a second opening will now be described with reference to FIGS. 6A-6D. FIGS. 6A-6D show a top plan view of a pixel opening, a first opening, and a second opening. A redundant description of the same constituent elements as the above-described constituent elements may not be repeated.

Figure 6A:
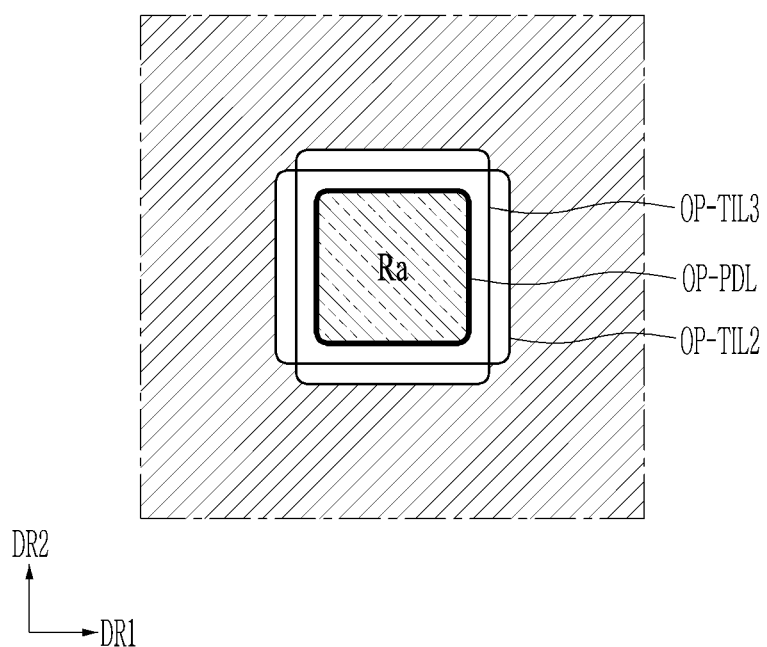
FIGS. 6A-6D show a top plan view of a pixel opening, a first opening, and a second opening according to one or more embodiments.

As shown in FIG. 6A, the pixel opening (OP-PDL) may substantially have a square shape. The first opening (OP-TIL2) may have a rectangular shape including a long side extending in the first direction DR1 and a short side extending in the second direction DR2. The second opening (OP-TIL3) may have a rectangular shape including a long side extending in the second direction DR2 and a short side extending in the first direction DR1. The first opening (OP-TIL2) is exchangeable with the second opening (OP-TIL3).

The pixel opening (OP-PDL) according to an embodiment may be smaller than the first opening (OP-TIL2) and the second opening (OP-TIL3) in the first direction DR1 and the second direction DR2. Without being limited thereto, as described with reference to FIG. 5A and FIG. 5B, the size of the pixel opening (OP-PDL) may be suitably modified.

Figure 6B:
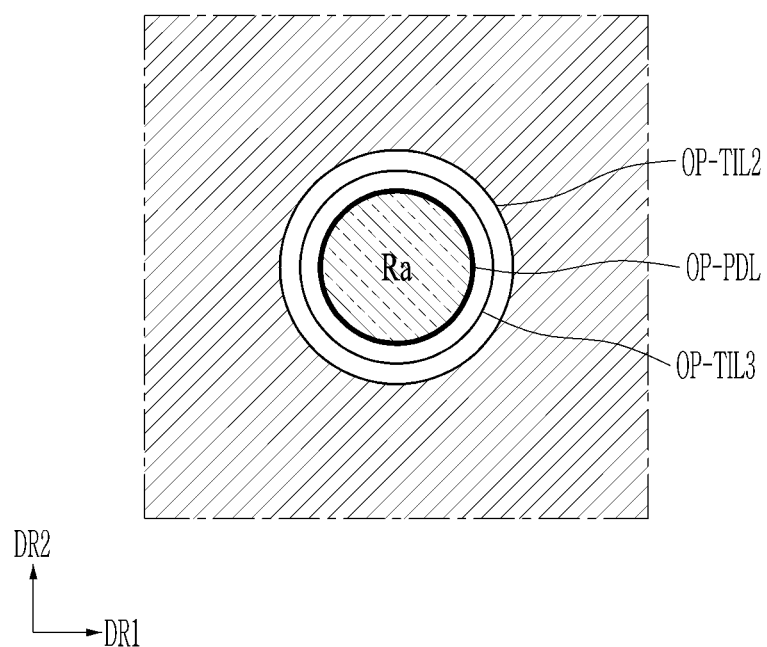

As shown in FIG. 6B, the pixel opening (OP-PDL) may have a substantially circular shape (e.g., a circular shape). The first opening (OP-TIL2) and the second opening (OP-TIL3) may also have substantially circular shapes (e.g., circular shapes) in a plan view. The size of the second opening (OP-TIL3) in a plan view may be smaller than the size of the first opening (OP-TIL2). Without being limited thereto, the first opening (OP-TIL2) may be smaller than the second opening (OP-TIL3). The size of the pixel opening (OP-PDL) in a plan view may be smaller than the size of the second opening (OP-TIL3), but the size of the pixel opening (OP-PDL) is not limited thereto.

Figure 6C:
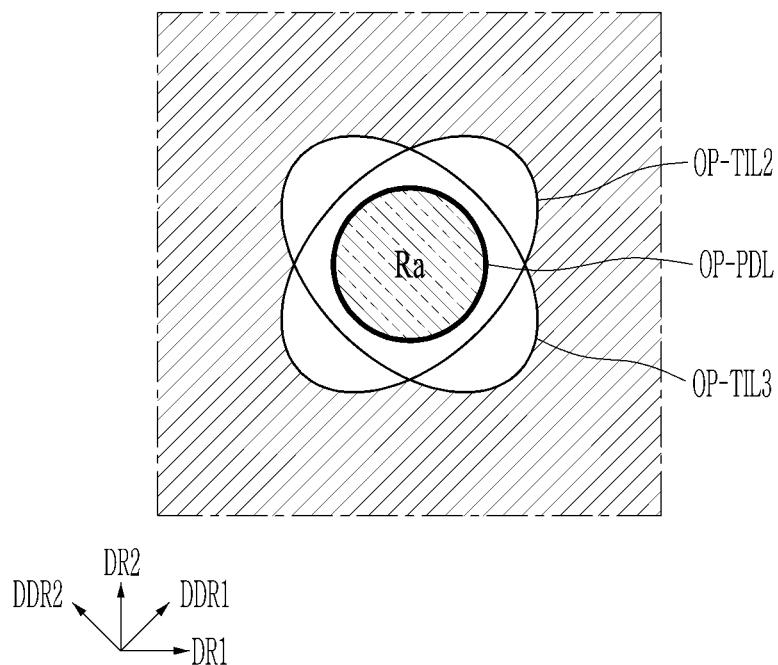

As shown in FIG. 6C, the pixel opening (OP-PDL) may have a substantially circular shape (e.g., a circular shape). The first opening (OP-TIL2) in a plan view may have an oval shape with a long radius extending in the first diagonal direction DDR1. The second opening (OP-TIL3) may have an oval shape with a long radius extending in the second diagonal direction DDR2. Without being limited thereto, the shapes of the first opening (OP-TIL2) and the second opening (OP-TIL3) are exchangeable with each other.

Figure 6D:
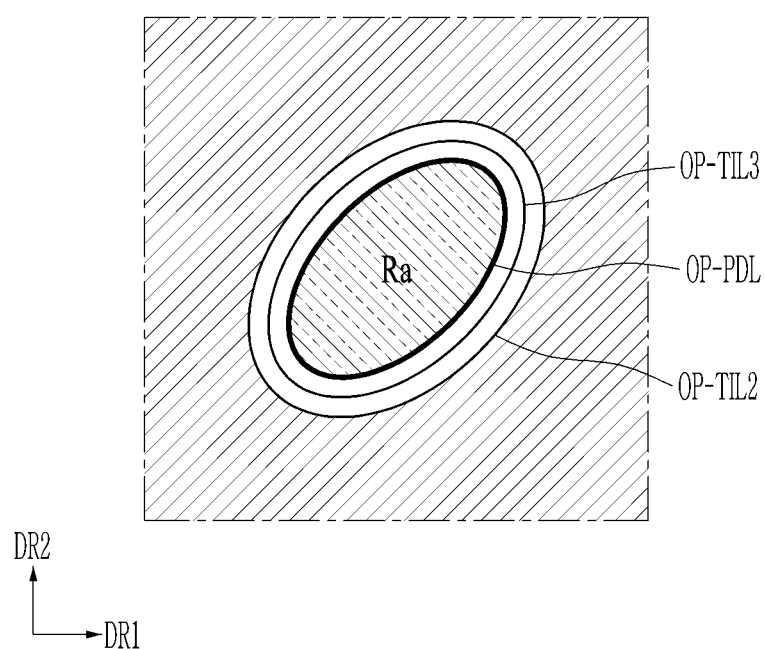

Further, as shown in FIG. 6D, the pixel opening (OP-PDL) may have a substantially oval shape (e.g., an oval shape). The first opening (OP-TIL2) in a plan view may have an oval shape with a long radius extending in the first diagonal direction DDR1. The second opening (OP-TIL3) in a plan view may have an oval shape with a long radius extending in the first diagonal direction DDR1. In the present specification, the pixel opening (OP-PDL), the first opening (OP-TIL2), and the second opening (OP-TIL3) are illustrated to have an oval shape with a long radius extending in the first diagonal direction DDR1, and without being limited thereto, the pixel opening (OP-PDL), the first opening (OP-TIL2), and the second opening (OP-TIL3) may have an oval shape with a long radius extending in the second diagonal direction DDR2.

Figure 7:
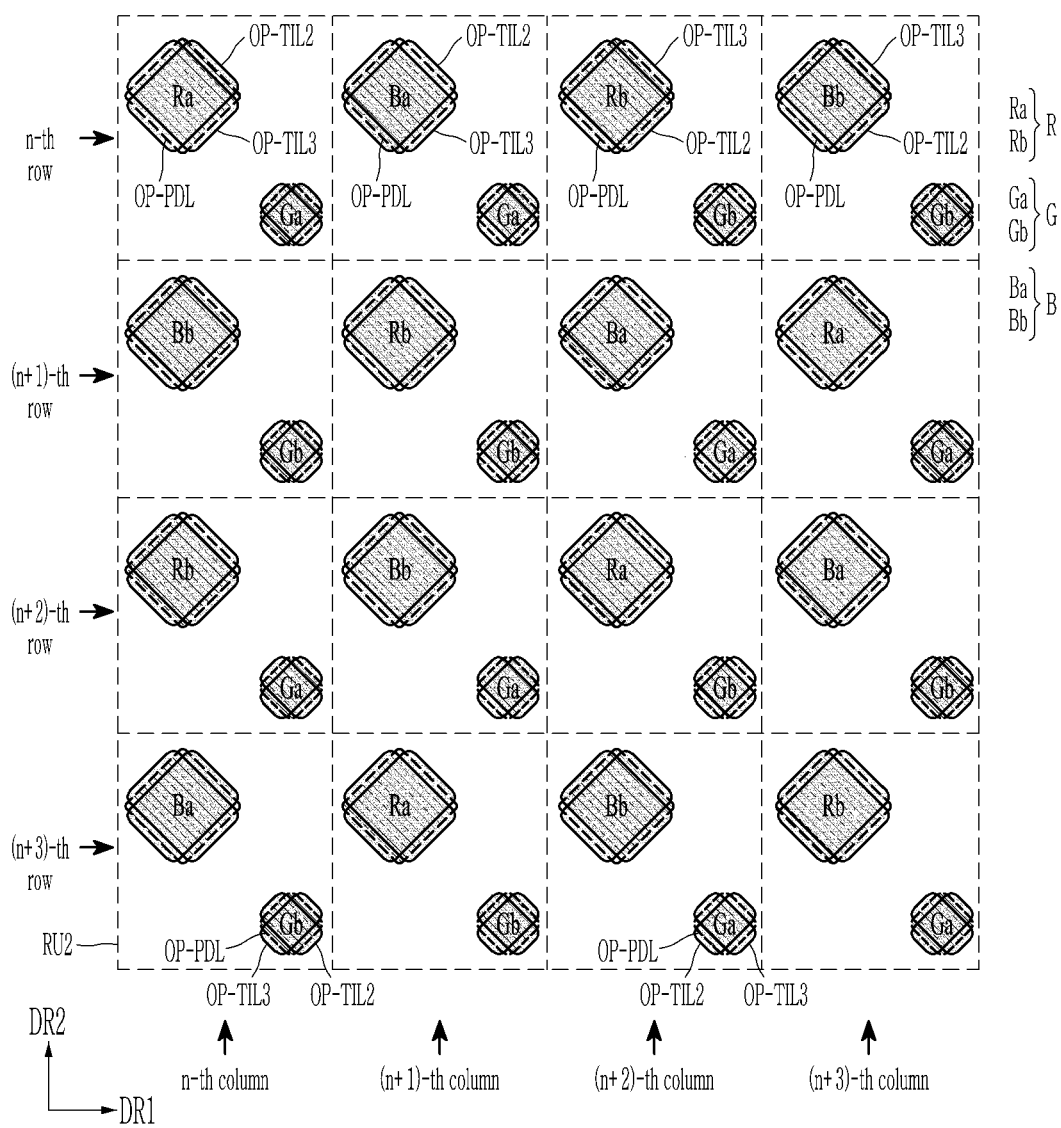
FIGS. 7-10 show a top plan view of a plurality of pixels according to one or more embodiments.

A disposal of a plurality of pixels including the 1-1 color pixel (Ra) and the 1-2 color pixel (Rb) and a change of sizes of the first opening and the second opening described with reference to FIG. 5A will now be described with reference to FIG. 7. FIGS. 7-10 show a top plan view of disposal of a plurality of pixels.

The first color pixel (R) includes a 1-1 color pixel (Ra) and a 1-2 color pixel (Rb). The second color pixel (G) includes a 2-1 color pixel (Ga) and a 2-2 color pixel (Gb). The third color pixel (B) includes a 3-1 color pixel (Ba) and a 3-2 color pixel (Bb).

The 1-1 color pixel (Ra), the 2-1 color pixel (Ga), and the 3-1 color pixel (Ba) may have the same relationship of the pixel opening (OP-PDL), the first opening (OP-TIL2), and the second opening (OP-TIL3) as the 1-1 color pixel (Ra) described with reference to FIG. 5A.

For example, the pixel opening (OP-PDL) may have a rhombus shape in a plan view, the first opening (OP-TIL2) may have a rectangular shape including a long side extending in the first diagonal direction and a short side extending in the second diagonal direction, and the second opening (OP-TIL3) may have a rectangular shape including a long side extending in the second diagonal direction and a short side extending in the first diagonal direction. However, the present disclosure is not limited thereto.

The 1-2 color pixel (Rb), the 2-2 color pixel (Gb), and the 3-2 color pixel (Bb) may have the same relationship of the pixel opening (OP-PDL), the first opening (OP-TIL2), and the second opening (OP-TIL3) as the 1-2 color pixel (Rb) described with reference to FIG. 5B.

For example, as shown in FIG. 5B, the pixel opening (OP-PDL) may have a rhombus shape in a plan view, the first opening (OP-TIL2) may have a rectangular shape including a long side extending in the second diagonal direction and a short side extending in the first diagonal direction, and the second opening (OP-TIL3) may have a rectangular shape including a long side extending in the first diagonal direction and a short side extending in the second diagonal direction.

According to an embodiment, the display panel may include a plurality of pixels R, G, and B. One first color pixel (R) and one second color pixel (G), or one second color pixel (G) and one third color pixel (B), may configure or form one repetition unit RU2. For example, one repetition unit RU2 may be formed of one first color pixel (R) and one second color pixel (G) and another repetition unit RU2 may be formed of one second color pixel (G) and one third color pixel (B). However, the present disclosure is not limited thereto.

With reference to a repetition unit RU2 as shown in FIGS. 7-10, four repetition units RU2 may be positioned in the first direction DR1 (e.g., a row direction), and four repetition units RU2 may be positioned in the second direction DR2 (e.g., a column direction). Therefore, sixteen repetition units RU2 may be positioned as shown in FIGS. 7-10. Although sixteen repetition units RU2 are shown in FIGS. 7-10, the number of repetition units RU2 is not limited thereto because the repetition units RU2 may be repeatedly disposed to provide any suitable number of repetition units RU2 along any suitable direction (e.g., a first direction DR1 and/or a second direction DR2) of the display panel.

A 1-1 color pixel (Ra), a 3-1 color pixel (Ba), a 1-2 color pixel (Rb), and a 3-2 color pixel (Bb) may be disposed on the n-th row. A 3-2 color pixel (Bb), a 1-2 color pixel (Rb), a 3-1 color pixel (Ba), and a 1-1 color pixel (Ra) may be disposed on the (n+1)-th row. A 1-2 color pixel (Rb), a 3-2 color pixel (Bb), a 1-1 color pixel (Ra), and a 3-1 color pixel (Ba) may be disposed on the (n+2)-th row. A 3-1 color pixel (Ba), a 1-1 color pixel (Ra), a 3-2 color pixel (Bb), and a 1-2 color pixel (Rb) may be disposed on the (n+4)-th row. Two 2-1 color pixels (Ga) and two 2-2 color pixels (Gb) may be sequentially disposed on the n-th row and the (n+2)-th row. Two 2-2 color pixels (Gb) and two 2-1 color pixels (Ga) may be sequentially disposed on the (n+1)-th row and the (n+3)-th row. Here, n is natural number that is equal to or greater than 1.

Figure 8:
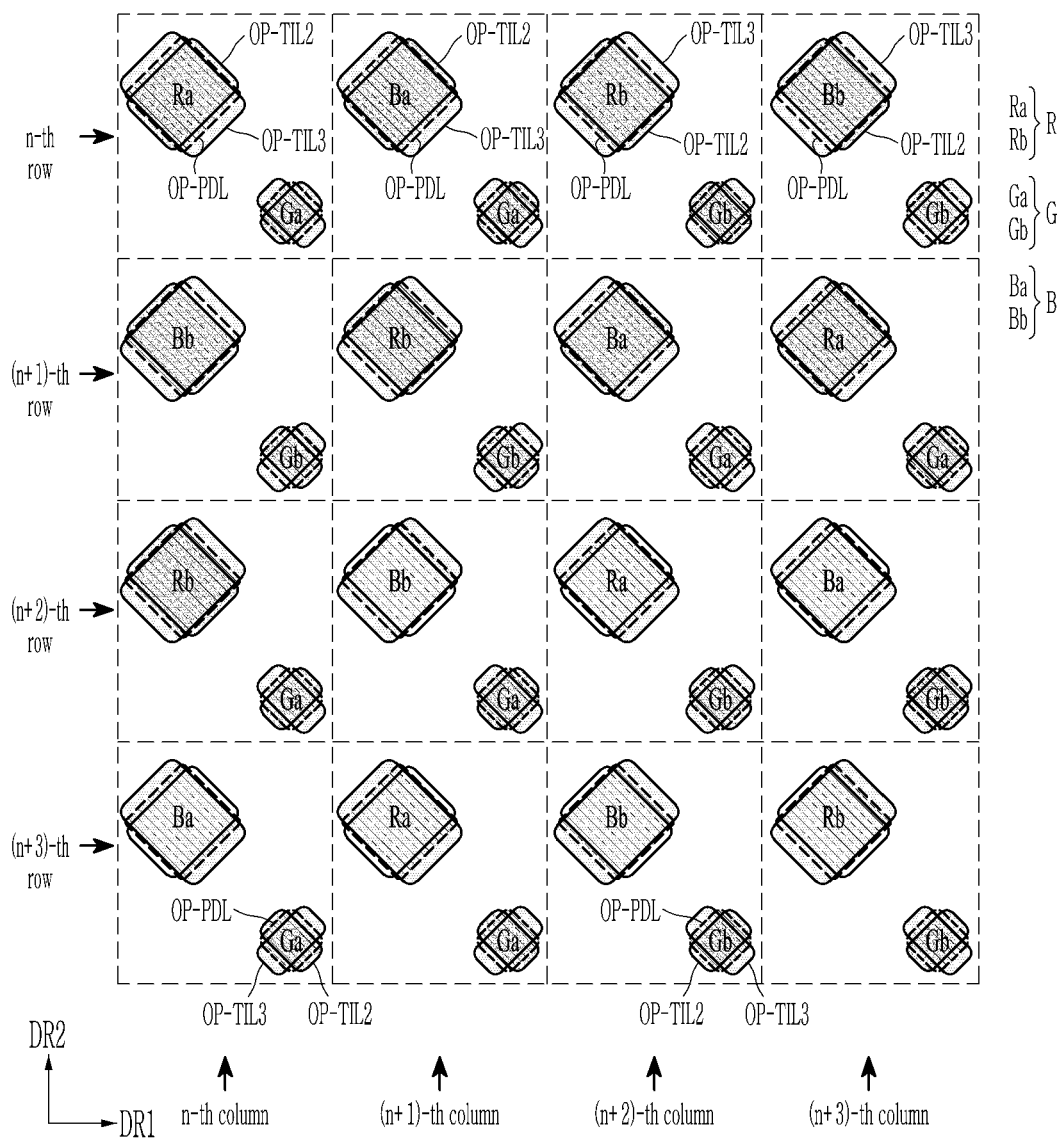
Figure 9:
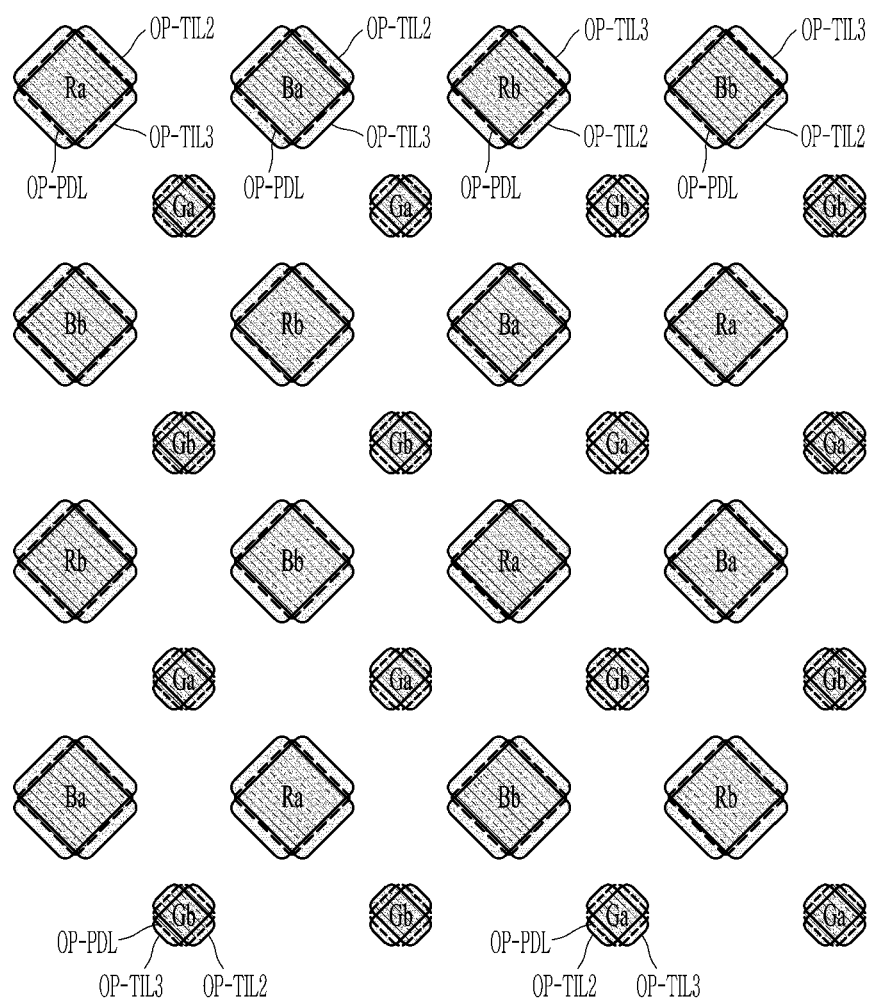
Figure 10:
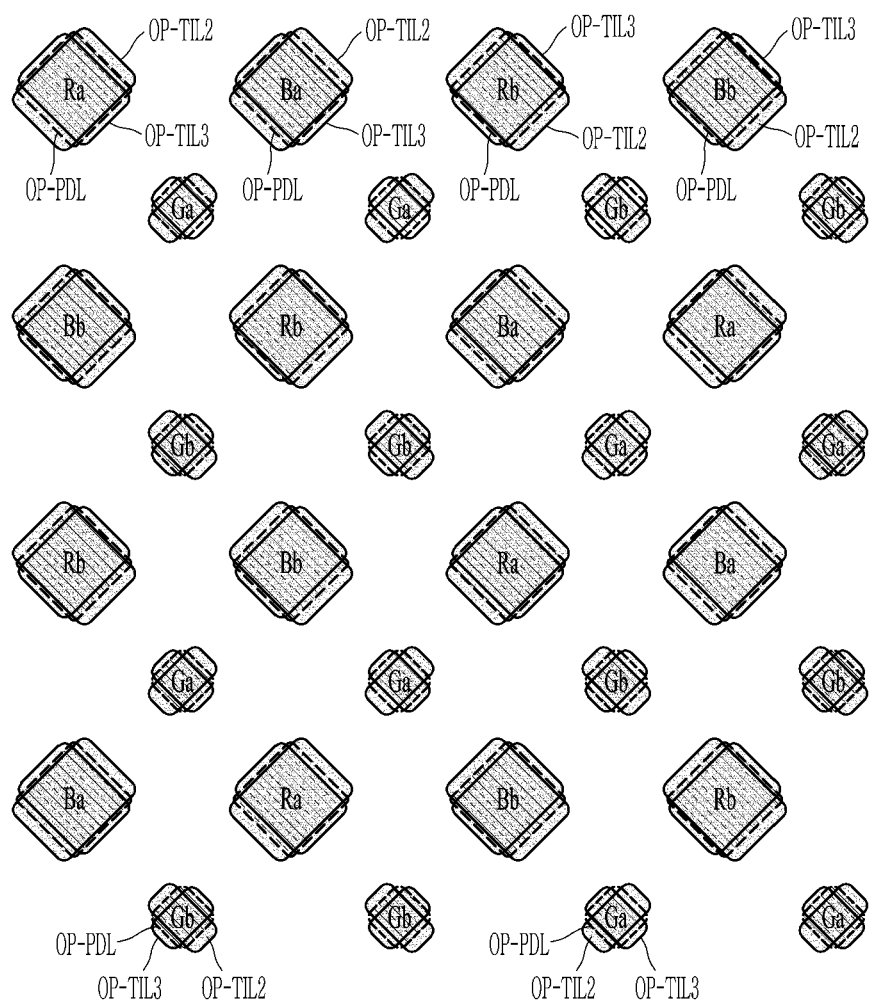

The sizes of the first opening (OP-TIL2) and the second opening (OP-TIL3) may be modified in various suitable ways depending on embodiments. For example, as shown in FIG. 8, the second opening (OP-TIL3) may have a relatively extended long side with reference to the embodiment shown in FIG. 7. Further, as shown in FIG. 9, the second opening (OP-TIL3) may have a relatively extended long side with reference to the embodiment shown in FIG. 7, and the first opening (OP-TIL2) may have a relatively extended long side with reference to the embodiment shown in FIG. 7. Further, as shown in FIG. 10, the first opening (OP-TIL2) may have a relatively extended long side with reference to the embodiment shown in FIG. 7. That is, as shown in FIGS. 7-10, the sizes of the first opening (OP-TIL2) and the second opening (OP-TIL3) may be modified in various suitable ways. In this case, the sizes of the first opening (OP-TIL2) and the second opening (OP-TIL3) may be modified in various suitable ways within a range covering the touch electrode (TE).

Figure 11:
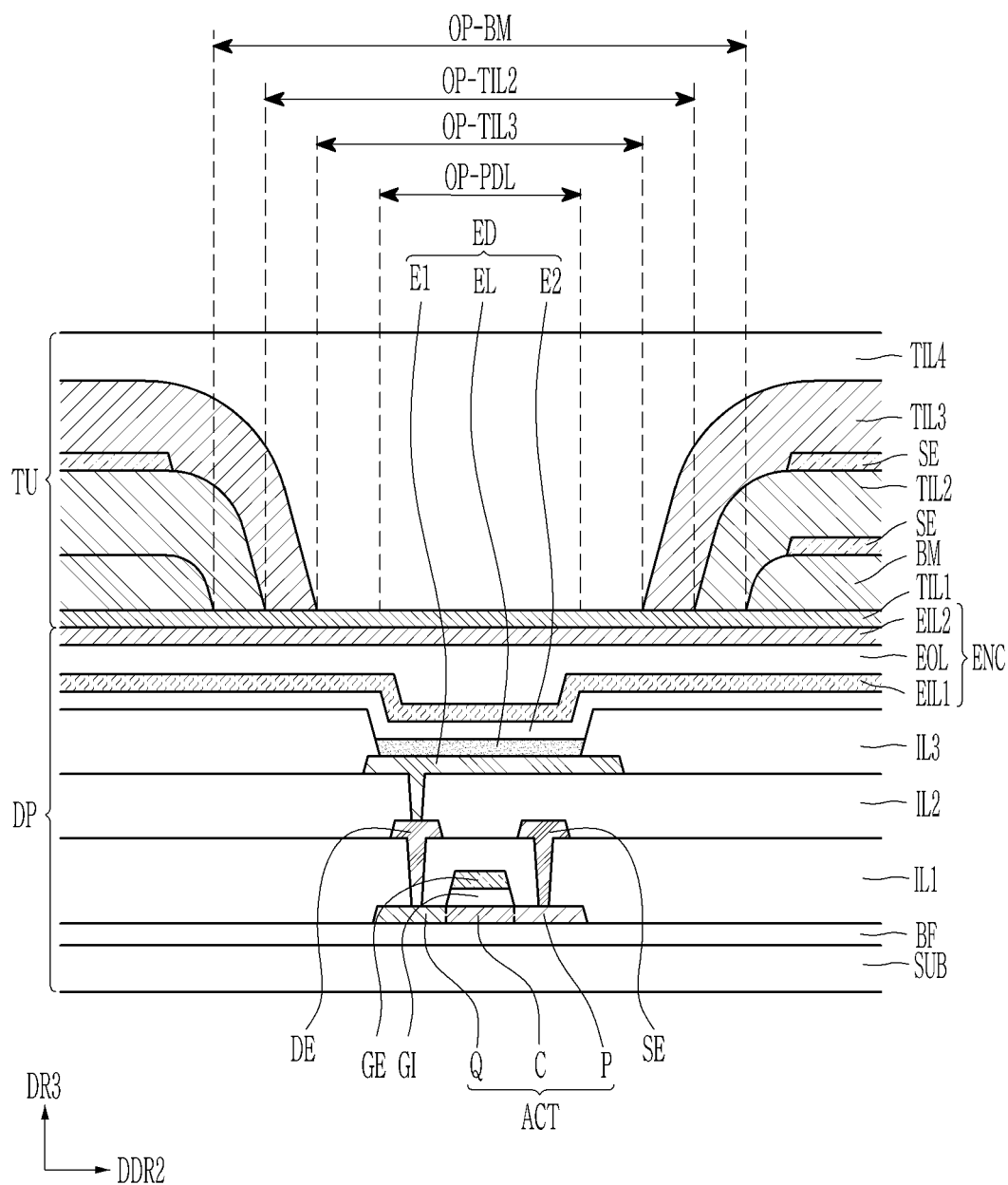
FIGS. 11-13 show a cross-sectional view of a display panel and a touch sensing unit according to one or more embodiments.
Figure 12:
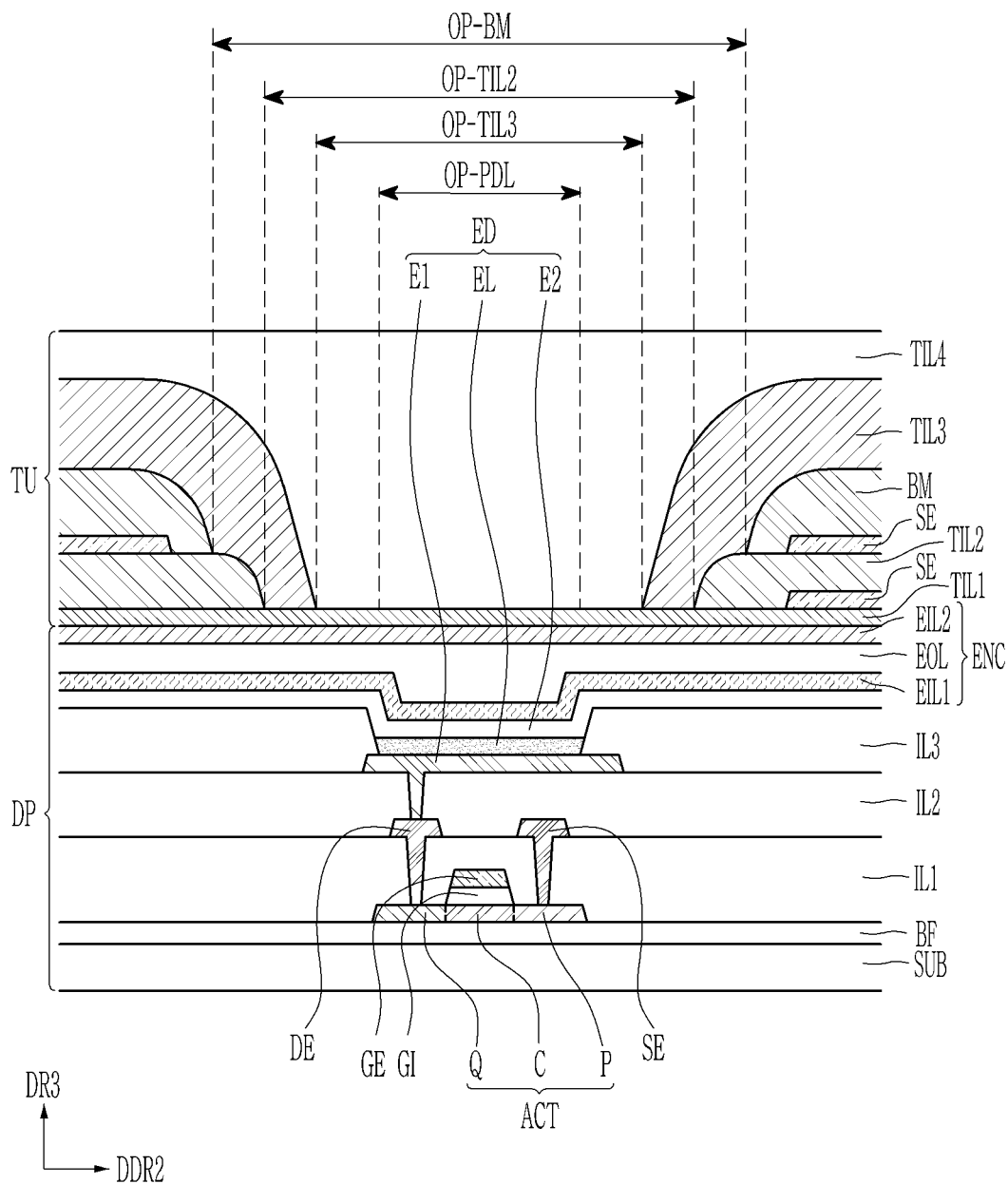
Figure 13:
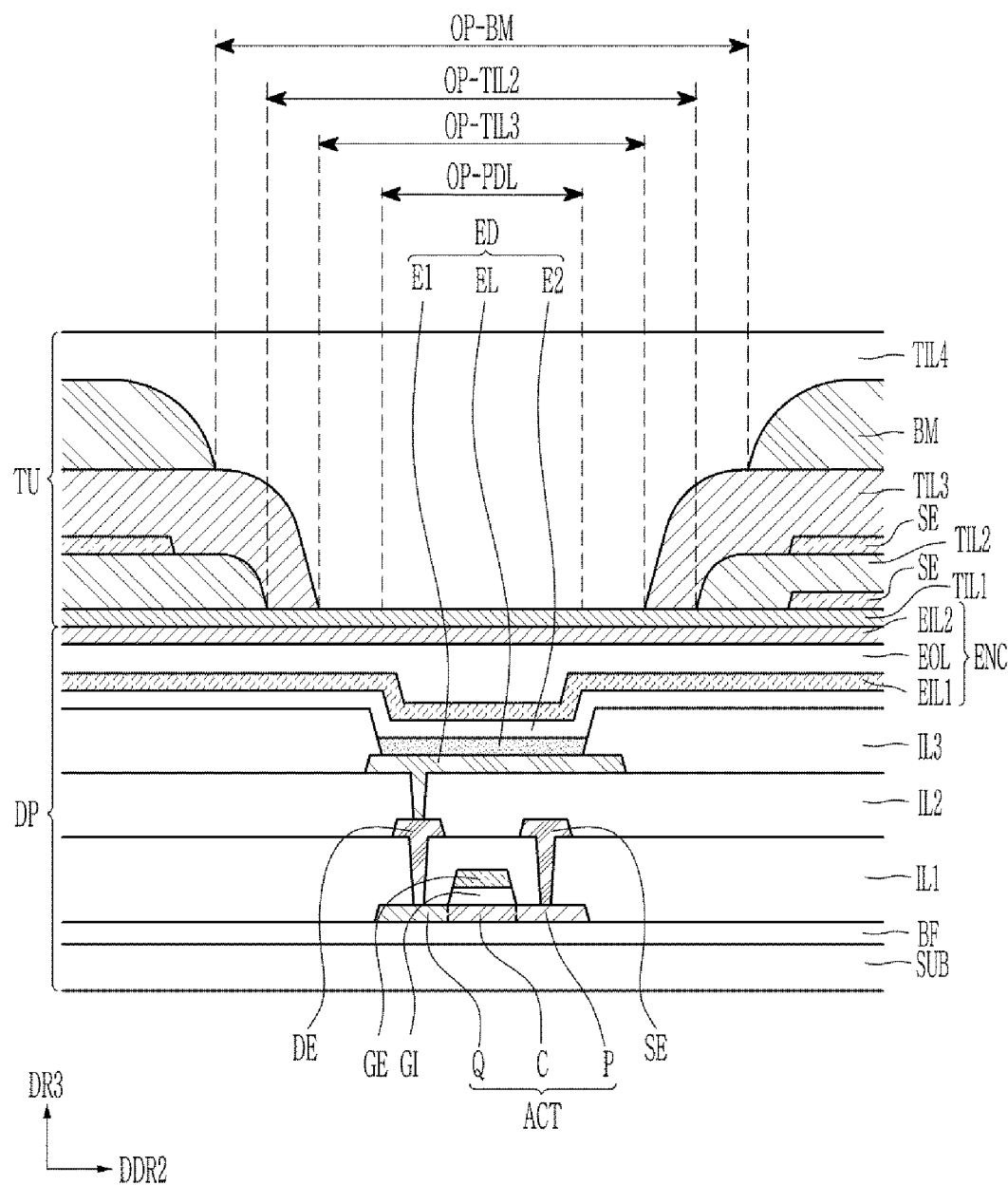

A display device according to one or more embodiments will now be described with reference to FIGS. 11-13. FIGS. 11-13 show a cross-sectional view of a display panel and a touch sensing unit according to one or more embodiments. A redundant description of the same constituent elements as the above-described constituent elements may not be repeated.

Referring to FIG. 11, the touch sensing unit (TU) according to an embodiment may include a first touch insulating layer (TIL1), a light blocking layer (BM) positioned on the first touch insulating layer (TIL1), a touch electrode (TE) positioned on the light blocking layer (BM), a first low refraction layer (TIL2) positioned on the touch electrode (TE), a touch electrode (TE) positioned on the first low refraction layer (TIL2), a second low refraction layer (TIL3) positioned on the touch electrode (TE), and a high refraction layer (TIL4) positioned on the second low refraction layer (TIL3).

The light blocking layer (BM) may be positioned to overlap (e.g., overlap in a plan view) the non-emission area of the display panel (DP). The light blocking layer (BM) may be positioned to overlap (e.g., overlap in a plan view) the pixel defining layer (IL3) of the display panel (DP). The light blocking layer (BM) may include a light absorbing material or a light reflecting material. For example, the light blocking layer (BM) may include a black colored resin or a reflective metal.

The light blocking layer (BM) may include a light blocking opening (OP-BM). The light blocking opening (OP-BM) may have various suitable shapes such as a quadrangle, a circle, or an oval in a plan view. Part of the touch electrode (TE) may be positioned on the light blocking layer (BM).

A first low refraction layer (TIL2) may be positioned on part of the light blocking layer (BM) and the touch electrode (TE). The first opening (OP-TIL2) of the first low refraction layer (TIL2) may be smaller than the light blocking opening (OP-BM). The first low refraction layer (TIL2) may cover the end of the light blocking layer (BM).

Part of the touch electrode (TE) may be positioned on the first low refraction layer (TIL2). A second low refraction layer (TIL3) may be positioned on the first low refraction layer (TIL2) and the touch electrode (TE). The second opening (OP-TIL3) of the second low refraction layer (TIL3) may be smaller than the first opening (OP-TIL2). The second low refraction layer (TIL3) may cover the end of the first low refraction layer (TIL2). The second low refraction layer (TIL3) may overlap (e.g., overlap in a plan view) the end of the light blocking layer (BM) in addition to the end of the first low refraction layer (TIL2). The second opening (OP-TIL3) according to an embodiment may be larger than the pixel opening (OP-PDL), and without being limited thereto, the second opening (OP-TIL3) may be equal to or smaller than the pixel opening (OP-PDL).

A high refraction layer (TIL4) for filling the second opening (OP-TIL3) may be positioned on the second low refraction layer (TIL3).

Referring to FIG. 12, a touch electrode (TE), a first low refraction layer (TIL2), a touch electrode (TE), a light blocking layer (BM), a second low refraction layer (TIL3), and a high refraction layer (TIL4) may be sequentially stacked on the first touch insulating layer (TIL1).

The light blocking layer (BM) may be positioned between the first low refraction layer (TIL2) and the second low refraction layer (TIL3). The configuration may correspond to the embodiment described with reference to FIG. 11 except for a stacking position of the light blocking layer (BM). The light blocking layer (BM) may contact the upper side of the first low refraction layer (TIL2). Further, the lateral side and the upper side of the light blocking layer (BM) may contact the second low refraction layer (TIL3). The second low refraction layer (TIL3) may cover the end of the light blocking layer (BM) and the end of the first low refraction layer (TIL2), and may contact the light blocking layer (BM) (e.g., the end of the light blocking layer (BM)).

Referring to FIG. 13, part of a touch electrode (TE), a first low refraction layer (TIL2), another part of the touch electrode (TE), a second low refraction layer (TIL3), a light blocking layer (BM), and a high refraction layer (TIL4) may be sequentially stacked on the first touch insulating layer (TIL1). An embodiment described with reference to FIG. 13 may be similar to embodiments described with reference to FIG. 11 and FIG. 12, except for a transformation of the stacking structure in which the light blocking layer (BM) is positioned on the upper side of the second low refraction layer (TIL3).

As shown in FIGS. 11-13, the touch sensing unit (TU) may include a light blocking layer (BM) to absorb external light, and may improve reflected color by reducing reflection of external light.

Further, the light discharged by the light-emitting device is fully reflected at various interfaces and is gathered at the front side of the display device according to an embodiment, thereby improving front side light output efficiency of the display device. The front side light outputting efficiency may be improved in the first diagonal direction and the second diagonal direction in a plan view.

While the present disclosure has been described in connection with embodiments, it is to be understood that the present disclosure is not limited to the disclosed embodiments, but, on the contrary, is intended to cover various modifications and equivalent arrangements included within the spirit and scope of the appended claims, and equivalents thereof.

| Description of some of the reference symbols | |
| --- | --- |
| SUB: substrate | E1: first electrode |
| EL: emission layer | E2: second electrode |
| OP-PDL: pixel opening | OP-TIL2: first opening |
| OP-TIL3: second opening | TIL2: first low refraction layer |
| TIL3: second low refraction layer | TE: touch electrode |
| TIL4: high refraction layer | ENC: encapsulation layer |

What is claimed is:

1. A display device comprising:
a substrate;
a transistor on the substrate;
a first electrode electrically connected to the transistor;
a pixel defining layer on the first electrode, the pixel defining layer including a pixel opening overlapping the first electrode;
an emission layer and a second electrode overlapping the first electrode;
a touch electrode on the second electrode;
a first low refraction layer and a second low refraction layer overlapping the touch electrode; and
a high refraction layer on the second low refraction layer,
wherein the first low refraction layer includes a first opening,
wherein the second low refraction layer includes a second opening,
wherein the first opening, the second opening, and the pixel opening have different widths in a first diagonal direction, and
wherein a part of the touch electrode is between the first low refraction layer and the second low refraction layer.

2. The display device of claim 1, wherein the first low refraction layer and the second low refraction layer have different refractive indexes.

3. The display device of claim 1, wherein the second opening is smaller in width in the first diagonal direction than the first opening.

4. The display device of claim 1, wherein the first opening, the second opening, and the pixel opening have different widths in a second diagonal direction.

5. The display device of claim 4, wherein the first opening is smaller in width in the second diagonal direction than the second opening.

6. The display device of claim 4, wherein an end of the second low refraction layer is on an upper surface of the first low refraction layer in the second diagonal direction.

7. The display device of claim 4, wherein the first diagonal direction and the second diagonal direction are perpendicular to each other.

8. The display device of claim 4, wherein the second opening is smaller in width in the second diagonal direction than the first opening.

9. The display device of claim 1, wherein an end of the second low refraction layer covers an end of the first low refraction layer in the first diagonal direction.

10. The display device of claim 1, wherein the first opening is smaller in width in the first diagonal direction than the second opening.

11. The display device of claim 1, wherein the display device comprises a plurality of pixels on the substrate,
wherein the plurality of pixels comprises a first color pixel, a second color pixel, and a third color pixel, and
wherein the first electrode, the pixel opening, the first opening, and the second opening are on a corresponding one of the plurality of pixels.

12. The display device of claim 1, wherein a refractive index of the second low refraction layer is greater than a refractive index of the first low refraction layer, and
wherein a refractive index of the high refraction layer is greater than a refractive index of the second low refraction layer.

13. A display device comprising:
a substrate;
a transistor on the substrate;
a first electrode electrically connected to the transistor;
a pixel defining layer on the first electrode, the pixel defining layer including a pixel opening overlapping the first electrode;
an emission layer and a second electrode overlapping the first electrode;
a touch electrode on the second electrode;
a first low refraction layer and a second low refraction layer overlapping the touch electrode; and
a high refraction layer on the second low refraction layer,
wherein part of the touch electrode is between the first low refraction layer and the second low refraction layer,
wherein the first low refraction layer includes a first opening,
wherein the second low refraction layer includes a second opening, and
wherein the first opening and the second opening have a circular shape or an oval shape in a plan view.

14. The display device of claim 13, wherein a refractive index of the second low refraction layer is greater than a refractive index of the first low refraction layer.

15. The display device of claim 13, wherein the first low refraction layer and the second low refraction layer comprise an organic material.

16. The display device of claim 13, wherein the display device further comprises:
an encapsulation layer on the second electrode; and
a first inorganic insulating layer on the encapsulation layer.

17. The display device of claim 16, wherein the display device further comprises a light blocking layer between a first touch insulating layer and the high refraction layer.

18. The display device of claim 13, wherein the second opening is smaller in width in a first diagonal direction than the first opening, and
wherein the first opening is smaller in width in a second diagonal direction than the second opening.

19. The display device of claim 18, wherein an end of the second low refraction layer covers an end of the first low refraction layer in the first diagonal direction, and wherein an end of the second low refraction layer is on an upper surface of the first low refraction layer in the second diagonal direction.

20. The display device of claim 13, wherein the first opening is smaller in width in a first diagonal direction than the second opening, and wherein the second opening is smaller in width in a second diagonal direction than the first opening.

* * * * *